United States Patent
Kwan

(10) Patent No.: US 9,366,976 B2
(45) Date of Patent: Jun. 14, 2016

(54) OPTICAL ELEMENT WITH LOW SURFACE FIGURE DEFORMATION

(75) Inventor: Yim-Bun Patrick Kwan, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 441 days.

(21) Appl. No.: 13/366,593

(22) Filed: Feb. 6, 2012

(65) Prior Publication Data

US 2012/0140328 A1 Jun. 7, 2012

Related U.S. Application Data

(63) Continuation of application No. PCT/EP2009/061650, filed on Sep. 8, 2009.

(51) Int. Cl.
*G02B 5/18* (2006.01)
*G03F 7/20* (2006.01)

(52) U.S. Cl.
CPC ........ *G03F 7/70858* (2013.01); *G03F 7/70825* (2013.01)

(58) Field of Classification Search
CPC .. G02B 5/1861; G02B 5/1809; G02B 5/1814; G02B 26/0808; B42D 25/328
USPC ......... 359/572, 350, 359–360, 515, 527, 838, 359/846–849, 868–869, 871–881, 883
See application file for complete search history.

(56) References Cited

U.S. PATENT DOCUMENTS

| | | |
|---|---|---|
| 5,035,497 A | 7/1991 | Itoh |
| 5,917,644 A | 6/1999 | Lafiandra |
| 5,940,203 A | 8/1999 | LaFiandra |
| 6,068,380 A | 5/2000 | Lynn et al. |
| 7,073,915 B2 | 7/2006 | Okada et al. |

(Continued)

FOREIGN PATENT DOCUMENTS

| | | |
|---|---|---|
| CN | 1461977 A | 12/2003 |
| CN | 1782884 A | 6/2006 |

(Continued)

OTHER PUBLICATIONS

EP Office Action for corresponding EP Application No. 09 782 783.6, dated Jan. 2, 2013.

(Continued)

*Primary Examiner* — Bumsuk Won
*Assistant Examiner* — Tamara Y Washington
(74) *Attorney, Agent, or Firm* — Fish & Richardson P.C.

(57) ABSTRACT

A reflective optical element includes a body with a first reflective surface of a high precision geometrical form, which can be used for reflecting light in a wavelength range less than 50 nm in an EUV-lithographic projection exposure system. The body includes first and a second non-reflecting surfaces. Further, the body includes a single connection area formed on the first non-reflecting surface with at least one fixation surface inside the connection area for fixing the entire optical element directly or indirectly to at least one bearing surface of a bearing element. The second non-reflecting surface is different from the single connection area formed on the first non-reflective surface. The second non-reflecting surface at least partly surrounds the single connection area. At least one stress relief recess is formed into the body. The stress relief recess at least partly separates the first non-reflective surface from the second non-reflecting surface.

35 Claims, 12 Drawing Sheets

(56) References Cited

U.S. PATENT DOCUMENTS

| | | | |
|---|---|---|---|
| 7,289,222 B1* | 10/2007 | Schuster | G01B 11/2441 356/495 |
| 7,443,619 B2 | 10/2008 | Sakino et al. | |
| 7,607,786 B2* | 10/2009 | Nanjyo et al. | 353/99 |
| 2003/0147131 A1 | 8/2003 | Terasawa | |
| 2003/0224264 A1 | 12/2003 | Hirabayashi et al. | |
| 2004/0095567 A1 | 5/2004 | Ohsaki et al. | |
| 2004/0130809 A1 | 7/2004 | Antoni et al. | |
| 2004/0179192 A1 | 9/2004 | Mizuno et al. | |
| 2005/0248860 A1 | 11/2005 | Soemers et al. | |
| 2006/0092533 A1 | 5/2006 | Sogard | |
| 2006/0103908 A1 | 5/2006 | Loopstra et al. | |
| 2006/0114442 A1 | 6/2006 | Van Buel | |
| 2006/0192328 A1 | 8/2006 | Morrison et al. | |
| 2008/0218883 A1 | 9/2008 | Torii et al. | |
| 2010/0157270 A1 | 6/2010 | Muehlbeyer et al. | |

FOREIGN PATENT DOCUMENTS

| | | |
|---|---|---|
| CN | 1879046 A | 12/2006 |
| DE | 221563 | 9/1983 |
| DE | 199 33 248 | 2/2001 |
| EP | 1 197 776 | 4/2002 |
| EP | 1 533 832 | 5/2005 |
| EP | 1 780 569 A1 | 5/2007 |
| JP | 09-243316 A | 9/1997 |
| JP | 2000-338379 A | 12/2000 |
| JP | 2004-158787 A | 6/2004 |
| JP | 2004-363571 A | 12/2004 |
| JP | 2005-055553 | 3/2005 |
| JP | 2005-303206 A | 10/2005 |
| JP | 2006-140504 | 6/2006 |
| JP | 2008-218710 A | 9/2008 |
| TW | I276923 | 3/2007 |
| WO | WO 00/19260 | 4/2000 |
| WO | WO 02/065482 | 8/2002 |
| WO | WO 2005/026801 | 3/2005 |
| WO | WO 2008/004664 A | 1/2008 |
| WO | WO 2008/010821 | 1/2008 |

OTHER PUBLICATIONS

R. Zacharias et al., The National Ignition (NIF) Wavefront Control System, Third Annual International Conference on Solid State Lasers for Application to Inertial Confinement Fusion Monterey Convention Center, Jul. 7-12, 1998.

Japanese Office Action, with translation thereof, for corresponding JP Appl No. 2012-528229, mailed on Jun. 28, 2013.

G. Sarver et al., "SIRTF Primary Mirror Design, Analysis, and Testing", Proc. of SPIE vol. 1340, Cryogenic Optical Systems and Instruments IV, ed. R.K. Mehring, G.R. Pruitt (Nov. 1990).

Armin Schöppach, "Thermoelastic analysis, model correlation and related problems explained on the basis of the SILEX telescope", Spacecraft Structures, Materials and Mechanical Engineering, Proceedings of the Conference held by European Space Agency (ESA), CNES and DARA in Noordwijk, Mar. 27-29, 1996, p. 627.

Japanese Office Action, with translation thereof, for JP Appl No. 2012-528229, dated Mar. 4, 2014.

Taiwanese Office Action, with translation thereof, for TW Appl No. 099130280, dated Jun. 21, 2013.

Taiwanese Office Action, with translation thereof, for TW Appl No. 099130280, dated Jan. 3, 2014.

Chinese Office Action, with translation thereof, for CN Appl No. 200980161335.9, dated May 15, 2014.

Chinese Office Action, with translation thereof, for CN Application No. 200980161335.9, dated Dec. 29, 2014.

Chinese Office Action with English translation thereof for corresponding CN Appl. No. 200980161335.9, 32 pages, dated Jun. 3, 2015.

Taiwanese Office Action, with English translation, for TW-Patent Application 099130280, dated Jul. 28, 2015.

International Search Report and Written Opinion for corresponding PCT Application No. PCT/EP2009/061650, dated May 17, 2010.

Chinese Office Action, with translation thereof, for corresponding CN Appl No. 200980161335.9, dated Jul. 26, 2013.

* cited by examiner

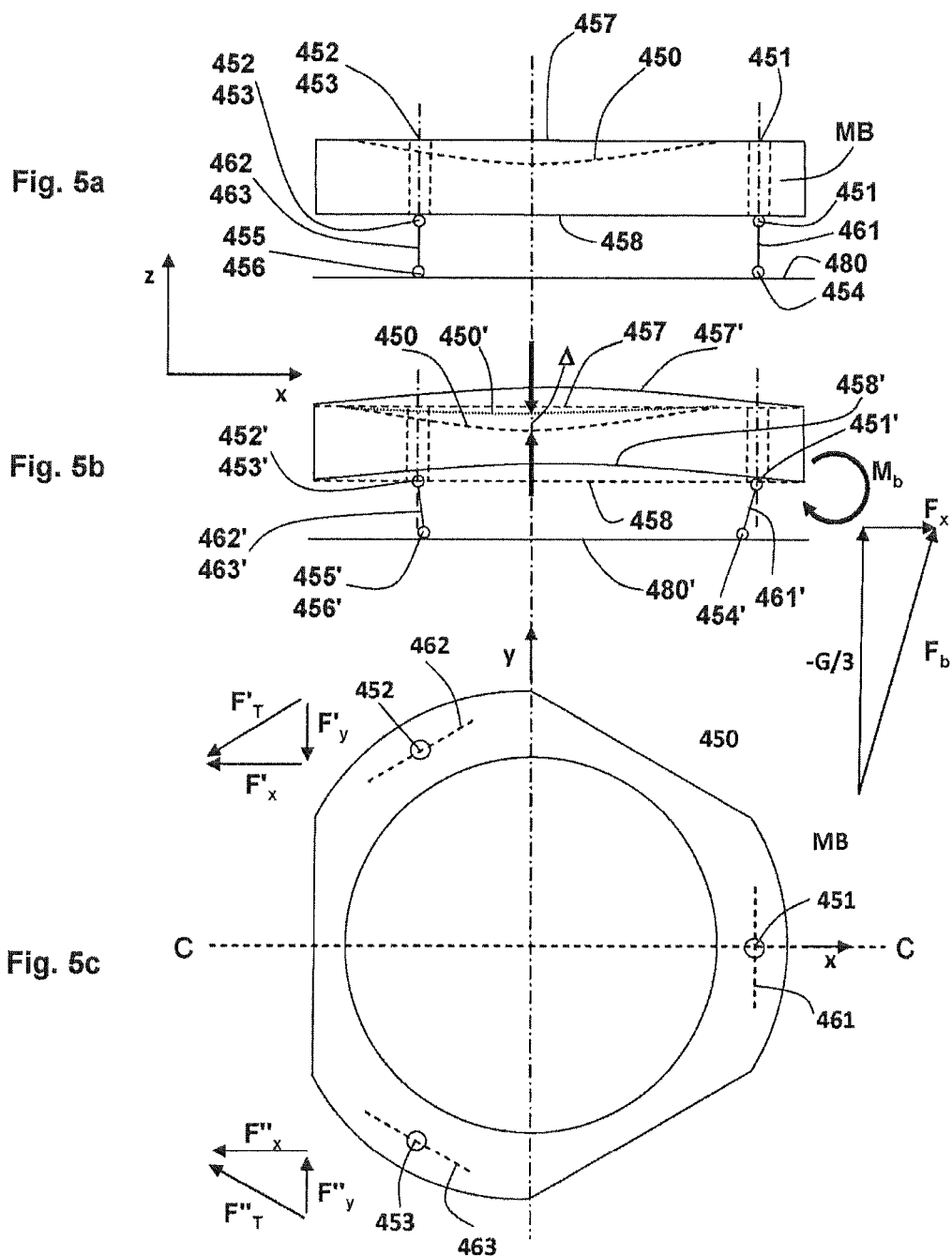

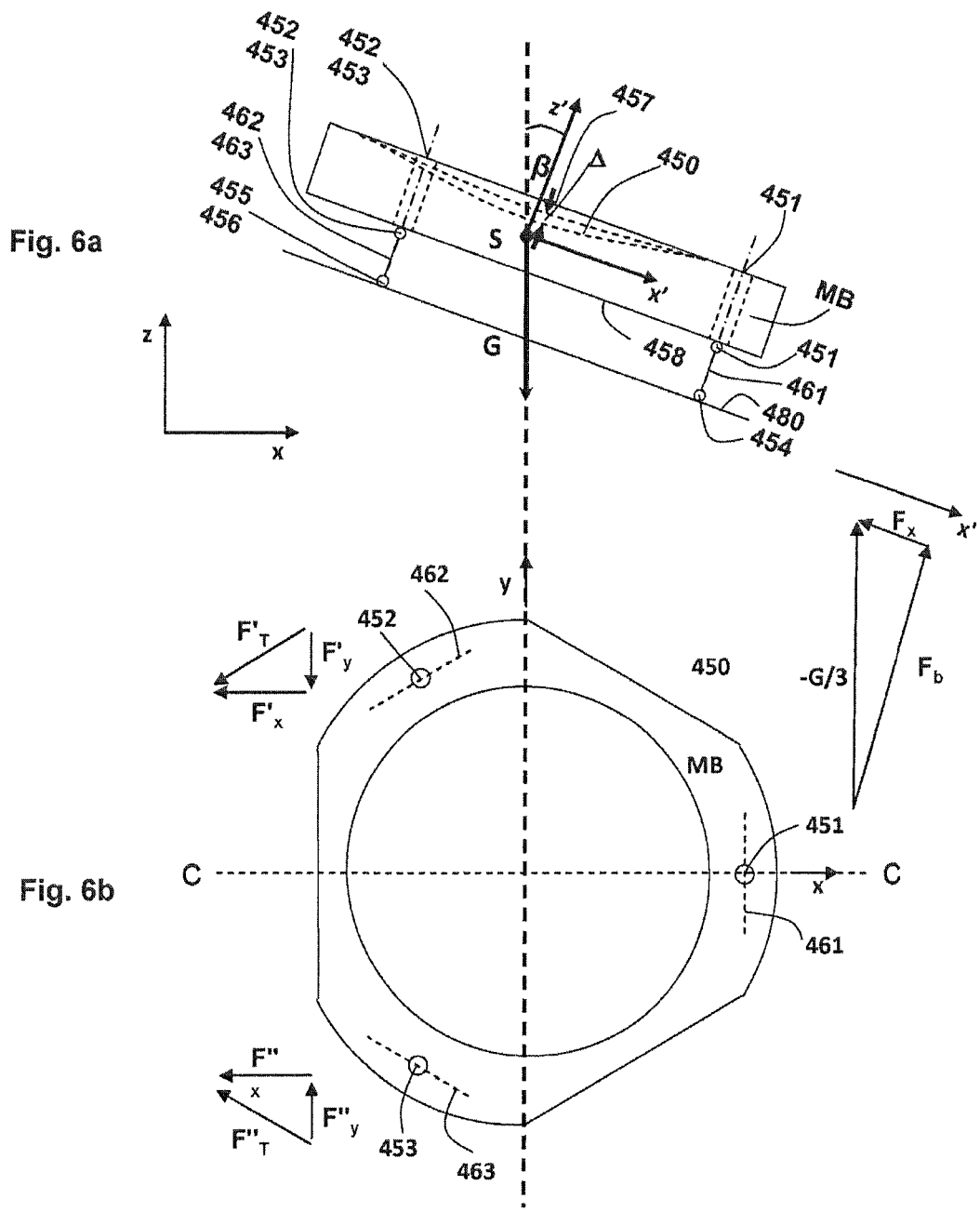

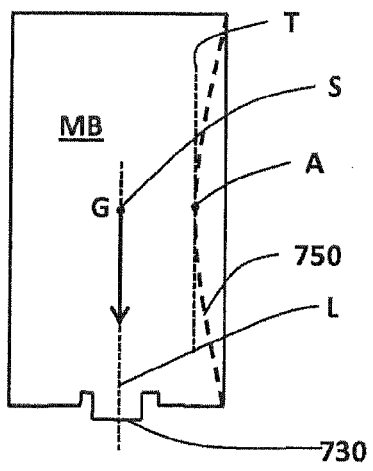
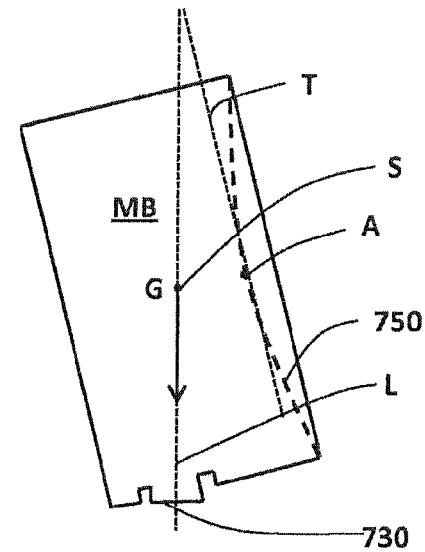
Fig. 8a
Fig. 8b
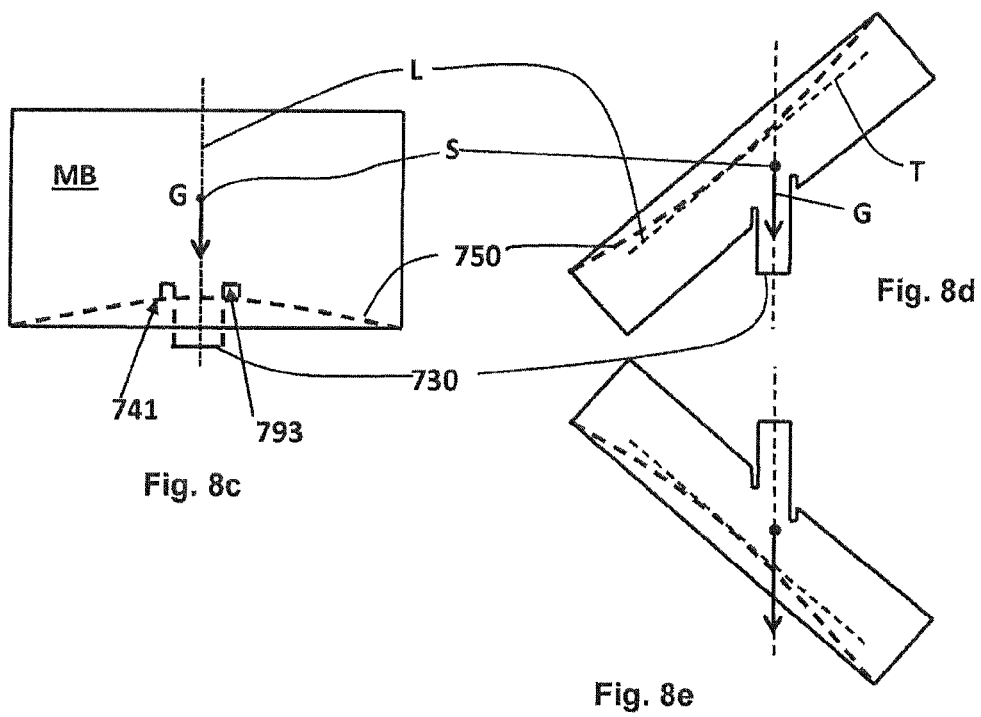
Fig. 8c
Fig. 8d
Fig. 8e

OPTICAL ELEMENT WITH LOW SURFACE FIGURE DEFORMATION

CROSS-REFERENCE TO RELATED APPLICATIONS

This application is a continuation of, and claims benefit under 35 USC 120 to, international application PCT/EP2009/061650, filed Sep. 8, 2009. International application PCT/EP2009/061650 is hereby incorporated by reference in its entirety.

FIELD

The disclosure relates to a reflective optical element with a high precision surface form, which can be used for reflecting light in a wavelength range less than 50 nm in an EUV-lithographic projection exposure system.

BACKGROUND

To reduce the size of microstructured devices such as semiconductor circuits (e.g. integrated, analogue, digital or memory circuits, thin-film magnetic heads) with the technique of optical lithography, it is desirable to improve the optical resolution limit of optical microlithographic projection exposure systems. Due to diffraction, the resolution limit in a first order approximation is inversely proportional to the numerical aperture of the projection lens of the microlithographic projection exposure system, with which structures are projected from a mask onto a substrate by a projection beam to form the microstructured devices there, e.g., by exposure of a light sensitive resist (which covers the substrate) with at least parts of the projection beam. For this, one focus is to increase the numerical aperture of the projection lens. Another focus is to reduce the used wavelength for the projection process, since the optical resolution limit is also proportional to this wavelength. For this reason, the historical development of optical lithography systems has been such that the wavelength of the light used in the projection process has been reduced from visible light to ultraviolet light to Deep Ultra Violet light (DUV light, such as 193 nm light, is produced, for example, by an advanced ArF excimer laser), which now is broadly used in mass production of semiconductor circuits. Today, mass production of high integrated circuits is usually done using microlithographic projection exposure systems with a projection light having a wavelength of 193 nm, and with the numerical aperture NA of the projection system, which project structures from a mask (or structured object) onto a substrate of much more than 1.0, sometimes even more than 1.3. In general, such high numerical apertures can only be achieved by the use of immersion systems whose principles are already described, for example, in DD 221563 A1 or in US 2006092533 A1.

For further reduction of the size of the microstructured devices, a further reduction of the wavelength of the projection light is desirable. Because in the deep ultraviolet wavelength range many optical materials become opaque due to molecular or atomic excitation, there are generally no suitable materials for optical lenses for wavelength below about 157 nm. Using even shorter wavelengths for the projection light, the projection lenses can only work with reflective optical elements such as mirrors or with diffractive optical elements. During the last years, enormous efforts have been made to develop optical microlithographic projection exposure systems, which work in the wavelength regime with wavelength less than 50 nm for the projection process. Systems working with a projection wavelength between 10 nm and 14 nm are described e.g. in EP 1533832 A1 or in US 20040179192 A1. Depending on the light sources which are available for the projection light of such short wavelengths, the wavelengths for the projection light may be even 5 nm or less. At wavelengths of 50 nm or less, the projection lenses of the optical microlithographic projection systems include only reflective optical elements such as mirrors and/or diffractive structures such as reflective diffractive structures. Projection systems using such a short projection wavelength in this extreme ultraviolet regime are known as EUV (Extreme Ultra Violet) lithographic projection exposure systems.

A simplified EUV lithographic projection exposure system 100 is schematically shown in FIG. 1. The system includes an EUV light source 1, producing EUV light with a significant energy density in the extreme ultraviolet or EUV spectral region, especially in the wavelength range less than 50 nm, preferably in a range between 5 nm and 15 nm. As EUV light sources discharged-produced or laser-produced plasma light sources are used, making use of e.g. xenon, tin or lithium plasma which generates the extreme ultraviolet light. Such sources irradiate unpolarized light under about 4 $\pi$ solid angle. Other sources generate a spatially more directed and a more polarized beam of extreme ultraviolet light such as e.g. synchrotron radiation sources. Depending on the EUV light source 1, especially if an EUV plasma light source is used, a collector mirror 2 may be used to collect the EUV light of the light source 1 to increase the energy density or irradiance of the EUV radiation and form an illumination beam 3. The illumination beam 3 illuminates via an illumination system 10 a structured object M. The structured object M is e.g. a reflective mask, including reflective and non-reflective or at least minor reflective regions to form at least one structure on it. Alternatively or in addition, the structured object includes or consists of a plurality of mirrors which are arranged about side by side in at least one dimension to form a mirror arrangement such as a mirror array. Advantageously the mirrors of the mirror array are adjustable about at least one axis to adjust the incidence angle of the illumination beam 3 which incidence on the respective mirror.

It shall be understood that the terms reflective, minor reflective and non-reflective relates to the reflectivity regarding the EUV light of the illumination beam 3. Due to the very short wavelength of the EUV light, the reflective surfaces are usually coated if the angle of incidence for the EUV light is less than about 45°. The coatings preferably include a multilayer of predetermined layer materials with predetermined layer thicknesses. Such mirrors are usually used for incidence angles less or far less than 45° down to about 0°. For such mirrors a reflectivity of more than 60% can be achieved due to a constructive interference of the reflected EUV light which is partially reflected at the various material boundaries of the individual layers of the multilayer. A further advantage of such multilayer-coated reflective mirrors or surfaces is their property to work in addition as a spectral filter, to make e.g. an illumination and/or projection beam of the EUV lithographic projection system more monochromatic. Such coated mirrors are sometimes also designated as normal incidence mirrors in an EUV lithographic projection exposure system.

For larger incidence angles than about 45°, especially for much larger incidence angles such as angles of about 70° and even more, it is sufficient if the reflective surface includes a metal or a metal layer such as Ruthenium, or if the reflective surface consists of a metal or a metal layer, including e.g. Ruthenium. At such high incidence angles, the reflectivity can be increased up to 60% and more without the necessity of a multilayer as mentioned above. As a general rule the reflectivity increases with increasing angle of incidence. Such mirrors are also designated as grazing incidence mirrors. EUV lithographic projection exposure systems often use plasma light sources. In this case, the collector mirror 2 can be a grazing incidence mirror as described e.g. in WO 2002/065482 A2 or US 2004/0130809 A1.

The structured object M reflects parts of the illumination beam 3 into a light path which forms a projection beam 4. The projection beam 4 carries the information of the structure of the structured object M and impinges on a projection lens 20 such that at least two diffraction orders of the structure or structures of the structured object M pass the projection lens 20 and form a kind of an image of the structure or structures of the structured object M on a substrate W. The substrate W, e.g. a wafer, including a semiconductor material such as silicon, is arranged on a substrate stage WS which is also called wafer stage.

In addition to the information about the structure of the structured object M, the projection beam also carries information about the illumination condition of how the structured object M is illuminated regarding angular, polarisation and intensity (or radiation power per unit area) in an object point OP of the structured object M, and of how these parameters are distribution over the illuminated surface of the structured object M. The kind of illumination is expressed by the term "setting". This means a predefined angular and/or polarisation and/or intensity distribution with which an object point OP is illuminated on the structured object M, and how these distributions depend on the spatial position on the structured object M. The setting also influences the optical resolution of the projection process, which is done by the projection lens 20. In general the optical resolution can be increased if the setting is adapted to the shape of the structure on the structured object M. Advanced illumination techniques which use adapted settings for the illumination of a structured object are described e.g. in "Resolution Enhancement Techniques in Optical Lithography" by Wong, Alfred Kwok-Kit; ISBN 0-8194-3995-9". The kind of illumination (the setting) can be adjusted with the illumination system 10, which includes a plurality of mirrors 12, 13, 14, 15, 16.

Without loss of generality, the projection lens 20 schematically shows four mirrors 21, 22, 23 and 24 as reflective optical elements to form a kind of an image of the structure of the structured object M on the wafer W. Such EUV projection lenses 20 typically include 4 to 8 mirror. These mirrors are made with very high precision regarding surface figure (or regarding their geometrical form) and surface roughness. Each deviation regarding the desired specification results in a degradation of the image quality on the substrate or wafer W. Usually the specification is such that e.g. the deviation from the surface figure is less than a tenth of the used projection wavelength. Depending on the used wavelength the surface figures of the mirrors 21, 22, 23 and 24 are made with a precision of even better than 1 nm, for some mirrors the desired precision is even a factor of 5 to 20 higher, and up to precision ranges of much smaller than one atom layer or better than 0.1 nm. It is desirable to keep this very high precision regarding the surface shape (surface figure or geometrical form) over a mirror dimension of more than 10 cm. Modern EUV projections lenses include mirrors of a diameter of 30 cm or even more with such a high precision regarding the surface figure. This very high mechanical precision is desired to form an image point IP on the substrate W from an illuminated object point OP on the structured object M by illuminating the object point OP with a well configured illumination beam according to a predetermined setting. Further, to project the such illuminated object point OP with the projection lens 20 with at least parts of the projection beam 4 onto the substrate W, the projection beam 4 is generated by the illumination beam 3 and the diffracting properties of the structured object M. One desirable condition to form an image on the substrate W is that the diffracted wave fronts, which are coming from an object point OP on the structured object M, interfere in the image point IP on the substrate or wafer W. To get a good image quality the interfering wave fronts desirably have a relative phase shift of far less than one wavelength of the projection beam light. Due to the various illumination settings, of how the structured object M can be illuminated by the illumination beam 3, the light path of the light passing one object point OP on the structured object M can vary within the projection lens 20 in such a way that light bundles of the projection beam 4 are reflected by the mirrors 21, 22, 23, 24 of the projection lens 20 at different surface areas with different sizes. This variation depends on the illumination settings and the position of the mirrors 21, 22, 23, 24 within the projection lens 20. To make sure that the image quality is achieved under all illumination settings it is desirable that the above-mentioned surface figure is achieved with the mentioned high mechanical precision.

Apart from the high mechanical precision of the surface figure of the mirrors 21, 22, 23, 24 in the projection lens 20, also the position and orientation of these mirrors 21, 22, 23, 24 relative to each other, relative to the structured object M and relative to the substrate W are in the same range of accuracy. This means that position and orientation of these objects (mirrors 21, 22, 23, 24, structured object M and substrate W) are adjusted also in the nanometer range or even below.

In addition, a metrology is desirable to allow the manufacturing of such precise mirror surfaces, the assembling of the projection lens of the EUV lithographic projection system, the integration of the assembled projection lens into the projection system, and to allow any in-situ monitoring and control of the system during the operation of the system.

To correct position and orientation of at least one mirror 21, 22, 23, 24 of the projection lens 20 this mirror 21, 22, 23, 24 can be actuated in up to 6 degrees of freedom. This means that the position coordinates of the mirror 21, 22, 23, 24 can be adjusted in space.

The mirror position is usually described with coordinates of a first coordinate system such as a Cartesian coordinate system which is used as a reference system. Such a reference system is given in FIG. 1 as a xyz-coordinate system in which the y-coordinate is perpendicular to the drawing plane, directing from the top to the bottom. If the mirror 21, 22, 23, 24 behaves like an ideal rigid body the position of the mirror is definitely defined, e.g. by giving the coordinates of a reference point of the mirror, such as e.g. its centre of gravity S in the reference xyz-coordinate system, express as $R=(R_x, R_y, R_z)$, as shown in FIG. 2. FIG. 2 schematically shows a cube shaped mirror body MB in the reference xyz-coordinate system. Of course, in the case of an ideal rigid body the position of the mirror body MB is also definitely defined if one arbitrary other reference point of the mirror is chosen, such as e.g. a corner A of the mirror body MB.

The orientations of the mirror(s) 21, 22, 23, 24 of the projection lens are usually described by three angle coordinates and, describing a relative orientation of a second coordinate system, which is fixed relative to the mirror body MB (or in general the rigid body) and which is designated as x'y'z'-coordinate system. These angles, e.g. chosen as Eulerian angles, describe the relative position of the coordinate axes of second x'y'z'-coordinate system to the axes of the reference xyz-coordinate system as also shown in FIG. 2. As one possibility, as shown in FIG. 2, the origin of second x'y'z'-coordinate system is located in the centre of gravity S of the mirror body MB, and the axes of this second coordinate system are parallel to the respective edgings of the cube shaped mirror body MB. However, the origin of the fixed second coordinate system can be at an arbitrary location in space in a way that the second x'y'z'-coordinate system is fixed relative to the mirror body MB. Also, the orientation of the axes of second x'y'z'-coordinate system relative to the mirror body MB may be arbitrary, but have a fixed relation to the mirror body MB. As shown in FIG. 2 as an example, the centre of gravity S or the origin of the fixed second coordinate system x'y'z' is at a position $R=(R_x, R_y, R_z)$ in the reference xyz-coordinate system. Further, the orientation of the mirror body MB is defined by the angular coordinates and 11 coordinates $R_x, R_y, R_z$, and are independent from each other, and each of these coordinates represent one degree of freedom for a movement of the ideal rigid mirror body MB. Depending on any movement constraints, caused by the bearings of the mirror body MB, the body can be moved in space in up to three independent translations such that the position $R=(R_x, R_y, R_z)$ of e.g. the centre of gravity is moved from a first point to a second point by translation. Additionally, also depending on the constraints, the mirror body MB can rotate in up to three independent rotation axes to align the mirror body MB in space from a start alignment to an end alignment. Such an end alignment is expressed e.g. by the Euleran angles and According to these angles the end alignment of second x'y'z'-coordinate system, and so the mirror body MB, is achieved by first rotating the mirror body MB by a rotation r1 of angle about a axis z" (being identical with the axis z' in the start alignment of the mirror body MB), carrying the y" axis (being identical with the axis y' in the start alignment of the mirror body MB) over into an axis y'" (see FIG. 2). After this first rotation, a second rotation r2 about the axis y' is done by the angle his second rotation r2 is carrying the z" axis (being identical with the axis z' in the start alignment of the mirror body MB) over into the z' axis of the end alignment. After this second rotation, a third rotation r3 by an angle about the z' axis in the end alignment is done, carrying the axis y'" over into the end alignment y'. Of course, any of the mentioned angles can be zero, if the mirror body rotates about less than three axes. FIG. 2 shows also the projection of the y'-axis of the end alignment onto the x"y"-plane of the x"y"z"-coordinate system which is designated as y""-axis.

However, in reality, the mirror body MB is not an ideal rigid body and so the shape of the body of the mirror itself may vary in time due to e.g. long-term effects, thermal effects or the influence of forces and torques which act on the mirror body MB. In this case the shape of the mirror body MB is described in the x'y'z'-coordinate system which is fixed relative to the body of the mirror at one point, e.g. the centre of gravity S. Such deformations are schematically shown in FIG. 3 in which the shown deformations Δ are mainly caused by a temperature gradient grad(T(x',y',z')) within the mirror body MB. In FIG. 3 the same reference numerals are designating the same elements as in FIG. 2. Such deformations can bring the reflective surface of the mirror to the limit of tolerance for the surface figure or even out of this limit. This results in an unacceptable degradation of the image quality of the EUV-projection lens 20. In an EUV-projection lens 20 such thermal deformations are in the range of about one nanometer even if the mirror bodies MB are made of glass ceramic materials such as e.g. Zerodur® (a registered trademark of Schott AG), or ULE® (a registered trademark of Corning Inc.) material. ULE® is a titania silicate glass, which is a vitreous mixture of $SiO_2$ and $TiO_2$. Both materials have a very low linear thermal expansion coefficient in the range of ± some ppb/K (parts per billion per Kelvin) or even zero for a certain narrow temperature range. The small deformations of the mirror body MB shown in FIG. 3 mainly result form temperature gradients inside the mirror body which can be up to 10K due to the absorption of parts of the projection beam 4. Even such small deformations of the surface figure of about 1 nm can be above the limit of tolerance.

As mentioned, the shape of the mirror body MB and therefore the surface figure of a reflective surface of the mirror 21, 22, 23, 24 can vary in time due to material properties and/or forces and/or torques or moments which vary in time. Since the accuracy of the surface figure is desirably maintained during the operation of the EUV-lithographic projection exposure system in the nm-range and even better, also the mounting system of the mirror and any actuation system for holding and actuating the mirror body MB fulfil extreme properties regarding mechanical precision. For this reason, the mounting system is desirably constructed in a way that any unintentional or parasitic forces and moments acting onto the mirror body MB are avoided, or are reduced as much as possible.

The above-mentioned extreme mechanical precision regarding position and surface figure of an EUV-mirror are realized in an EUV lithographic projection exposure system. To achieve this mechanical precisions very elaborated machine designs are involved, taking into account all factors of potential mechanical disturbances, such as e.g. mechanical vibrations, thermal effects, air pressure and gravitational influences, material properties and lots more.

It is known to mount optical elements with at least one operative optical surface, such as mirrors, in such a way that the optical element is supported, levitated or positioned with a single mounting device. Often the mounting device is positioned on a rear side of the operative optical surface (e.g. a reflecting or diffracting surface) of the optical element, or is positioned on a side being opposed or approximately opposed to the operative optical surface.

U.S. Pat. No. 6,068,380 describes a mounting assembly for a vehicle mirror with low demands regarding surface figure. The mirror is supported by a projecting ball portion on the mirror side being opposed to the reflective side of the mirror. This ball portion supports the mirror on a mirror support.

U.S. Pat. No. 5,035,497 describes a mirror support, including several mirror supporting devices for supporting a mirror in a certain attitude. The mirror support is constructed such that gravity does not influence a predetermined shape of the mirror surface. The mirror supporting devices support the mirror in the centre of gravity of the part of the mirror being supported by the respective mirror supporting device.

EP 1 780 569 A1 discloses a support mechanism for a reflecting mirror of high accuracy shape such as for telescopes. The support mechanism includes a bipod-like structure, including two legs for supporting the mirror. A centre axis is associated to each of the two legs along their supporting direction, having an intersecting point at the position of the centre of gravity of the reflecting mirror.

In US 2005/0248860 A1 a mirror actuator interface is disclosed to actuate a mirror in its neutral plane in up to six degrees of freedom. Further, the interface is compliant in certain degrees of freedom to minimize parasitic forces and moments or torques which are subjected to the mirror due to the actuator interface itself.

In DE 199 33 248 A1 a mirror telescope includes a primary mirror which directs the incoming light to a secondary mirror. The primary mirror is supported by a mirror body which includes a tube shaped mounting projection. The mounting projection is centred relative to the optical axis of the primary mirror and is drawn-out on the backside of the primary mirror. A similar space telescope is described in "Thermoelastic analysis, model correlation and related problems explained on the basis of the SILEX telescope" by Schoppach Armin published in "Spacecraft Structures, Materials and Mechanical Engineering, Proceedings of the Conference held by ESA", CNES and DARA in Noordwijk, 27-29 Mar. 1996 (Edited by W. R. Burke. ESA SP-386. Paris: European Space Agency (ESA), 1996, p.627; Bibliographic Code: 1996ESASP.386.6275)

An additional space telescope is described in "SIRTF Primary Mirror Design, Analysis, and Testing" by Saver Georg et al. published in "Proc. of SPIE Vol. 1340, Cryogenic Optical Systems and Instruments IV, ed. R. K. Mehring, G. R. Pruitt (November 1990)". There, a mirror assembly of a primary mirror is described in which the rear side of the mirror is arc shaped. Additionally the rear side of the mirror includes one flat section perpendicular to the optical axis of the mirror. The mirror is mounted onto a mirror support such that the flat section of the mirror is pressed against a flat section of the mirror support.

In WO 2008/010821 A2 a scan mirror is disclosed. The mirror is pivotally supported on a shaft arranged on a mirror side opposite of the reflecting surface. The shaft is pivoted on a holder and supports the mirror along a pivot axis. The pivot axis extends along a centre region of the mirror in a distance from the reflecting surface.

In U.S. Pat. No. 7,073,915 B2 a mirror fixing method and a mirror together with a mirror fixing device is described in which deformation of the shape of the mirror surface is reduced. The mirror includes a base plate carrying the reflecting surface on one side. On a side opposite to the reflecting surface a projection such as a bearing boss is formed or attached to the base plate. The mirror is fixed with the bearing boss.

In U.S. Pat. No. 7,443,619 an optical element holding apparatus is disclosed which holds a mirror suitable for an EUV lithographic projection exposure apparatus such that the mirror may be deformed to reduce any errors.

FIG. 4 shows schematically a mirror mounting assembly 400 with a mirror 421 as used in an EUV-lithographic projection exposure system 100, as described in e.g. in WO 2005/026801 A2. In addition, the reference xyz-coordinate system is given for orientation. The mirror 421 includes a mirror body MB made e.g. of Zerodur® or ULE®, or including e.g. one of the materials Zerodur® or ULE®. The mirror 421 also includes a reflective surface 450, including e.g. a multilayer of predetermined layer materials with predetermined layer thicknesses to improve the reflectivity of the projection beam 4 (FIG. 1). The mirror body MB is mounted by a kinematic mount at three mounting or linking points 451, 452, 453. At each of these mounting points the mirror body MB is connected with a bipod structure 461, 462, 463. At least one of these bipod structures may include an actuation device. Preferably, the actuation devices are Lorentz actuators, since these actuators are force controlled in the sense that the actuation force in a first order of approximation is proportional to an electric current or a magnetic field which results from the electric current. The bipod structures 461, 462, 463 are connected to the mirror body MB at the three linking points 451, 452, 453 by linking elements 471, 472, 473. Preferably each bipod structure 461, 462, 463 includes two Lorentz actuators such that the mirror body MB can be actuated in up to 6 degrees of freedom in the x-, y-, z-coordinates and the three Eulerian angles. The actuators are constructed such that there is no mechanical contact to a support structure 480 which is fixed at a housing structure 481 of the projection lens 20. The housing structure is sometimes also called a projection optical box or POB.

SUMMARY

Applicants conducted the following analysis of the subject matter shown in FIGS. 4 to 6.

The kinematic mount as described in FIG. 4 causes only very small deformations A (see FIG. 3) of the mirror body MB and of the reflective surface 450 due to gravity, when the magnitude of gravity and the direction of the line of force of the gravitational force relative to the mirror body MB, or relative to bipod structures 461, 462, 463, does not change in comparison to the original design properties. The gravity support points of the mirror body MB are the schematically shown linking points 451, 452, 453, and the gravity support on the supports structure 480 are approximated by support lines 454, 455, 456 of the bipod structures 461, 462, 463. In practice the linking points 451, 452, 453 are somewhere midway of the thickness of the mirror body MB. Preferably, they are arranged such that they support the mirror body MB at a neutral axis of the mirror body. Usually, the original design property is that each plane of a bipod structure, which is defined for each bipod structure by the support line on the support structure and its respective linking point or support point on the mirror body MB, is parallel to the direction of the line of force of the gravitational force. In this case the support forces of the bipod structures are also parallel to the gravitational forces of the mirror body MB which act on the respective linking points of the bipod structures. To show this situation, FIG. 5a schematically shows a side or sectional view of elements of the mirror mounting assembly 400 of FIG. 4 in a xz-plane along the x-axis or along the c-c-line shown in FIG. 4. In FIGS. 5a, 5b and 5c the same elements as shown in FIG. 4 are designated with the same reference numerals. FIG. 5c schematically shows a top view of the mirror body MB of FIG. 4 in the xy-plane together with the bipod structures 461, 462, 463 and the linking points 451, 452, 453. FIG. 5a shows an ideal state in which each plane of the bipod structures 461, 462, 463 is parallel to the direction of the line of force of the gravitational force, which is assumed to be directed in z-direction. In this case there are almost no force components in the xy-plane which are caused by the gravitational force. It can be further seen from FIG. 5a that the reflective surface 450 may have a curved shape, being curved in at least one dimension, whereas, as an example, the mirror body MB includes parallel top and bottom surfaces 457 and 458 which are arranged parallel to the xy-plane in this embodiment. In FIGS. 5a, 5b and 5c and also in the following figures the linking points are schematically shown on the lower surface of the mirror body MB. As mentioned, they are preferably arranged at a neutral axis of the mirror body.

In FIG. 5b the situation differs from the ideal situation shown in FIG. 5a in such a way that the planes of the bipod structures 461', 462', 463' are not longer parallel to the direction of the line of force of the gravitational force which directs along the z-direction. This may e.g. happen if the thermal expansion of the support structure 480 and the one of the mirror body MB is different and the temperature is changing. Additionally, even if the coefficient of thermal expansion (CTE) of the support structure and the mirror body MB is the same, a different expansion of these components may happen if these components are not at the same temperature. This easily can happen due to some absorption of the projection beam 4 (FIG. 1) by the reflective surface 450 of the mirror body MB such that the mirror body MB is at a slightly other temperature than the support structure 480. In such a case at each linking point 451', 452', 453', which each support ⅓ of the gravitational force G of the mirror body MB (it is assumed that the mirror body MB has a respective symmetry regarding its mass distribution), also is subjected to a force having at least components in the xy-plane or in a plane parallel to the xy-plane. This is due to the counter-force $F_b$ within the bipod structures 451', 452' and 453' ($F_b$ is laying in the plane of the bipod structure) which compensates the gravitational force, G/3 in the shown embodiment, and which has a different direction than the gravitational force since these structures are not longer parallel to the gravitational force G. For the linking point 451', whose bipod structure 461' is oriented perpendicular to the x-axis (regarding its support line 454'), the force $F_x$ in the shown example is directed in an outside direction along the x-axis. Similar at the two other linking points 452' and 453' there result the forces $F'_x$ and $F''_x$ to compensate the force $F_x$ at the linking point 451'. Since at the linking points 452', 453' the bipod structures 462' and 463' are arranged under an angle different from 90° to the x-axis (regarding their respective support lines 455', 456') there are also force components $F'_y$ and $F''_y$ in the y-direction, forming together with the respective forces $F'_x$ and $F''_x$ in the x-direction the resulting forces $F'_T$ and $F''_T$ which are oriented in the respective plane of the bipod structures 462', 463' (each defined by the respective support lines 455', 456' on the support structure 480 and its respective linking point or support point 452', 453'), and which act at the respective linking points 452' and 453'. These parasitic forces, being directed in the xy-plane or in a plane parallel thereto, cause a deformation of the mirror body MB, and such also a deformation of the reflecting surface from the original surface 450 to the distorted surface 450' by a magnitude of Δ. For comparison, also the undeformed upper and lower surfaces 457 and 458 are shown in FIG. 5b together with the deformed surfaces 457' and 458'.

Depending on the stiffness of the connection between the linking points 451', 452', 453' and the bipod structures 461', 462', 463' the slanting of the bipods from their original vertical position also cause additional bending moments, which additionally result in deformations of the mirror body MB or the reflective surface 450. As an example, a right turning moment $M_b$ is shown in FIG. 5b.

The parasitic forces and moments as described in FIG. 5 occur in embodiments of mirror assemblies in which the support structure 480 and the mirror body MB have different thermal expansion behaviour. In such cases the planes of the bipod structures, or in general the supporting structures, are no longer parallel to the gravitational force of the mirror body MB. Of course other supporting structures may be used than bipod structures. However, the described parasitic forces and torques or moments also appear in such other supporting structures if these structures compensate the gravitational force G of the mirror body by support forces which have force components which are not parallel to the gravitational force.

Further, the above described parasitic forces and moments also appear if any support structure is not properly assembled, or if the assembling tolerances are too broad. In such cases the same situation may happen as described in connection with FIG. 5b, resulting in a deformation Δ of the reflecting surface 450.

Even if the mirror mounting assembly 400 of FIG. 4 is perfectly mounted to the housing structure 481 it may occur that the housing structure 481 itself is not aligned in a proper way, such that the gravitational force of the mirror body is not parallel to the support forces caused by the supporting structures such as the above described bipod structures. This situation is schematically shown in FIG. 6 in which the same elements as in FIG. 4 and in FIG. 5 are designated by the same reference numerals.

FIG. 6a schematically shows a side view of elements of the mirror mounting assembly 400 of FIG. 4 in a xz-plane along the x-axis or along the c-c-line shown in FIG. 4. However, now the mirror body MB is tilted about the y-axis relative to the gravitational force G direction by an angle β, as shown with the help of the second x'y'z'-coordinate system which is fixed e.g. at the centre of mass S of the mirror body and as it was described in FIG. 2 and FIG. 3. FIG. 6b shows a top view of the mirror body MB of FIG. 4 in the xy-plane together with the bipod structures 461, 462, 463 and the linking points 451, 452, 453, if the mirror mounting assembly 400 of FIG. 4 is tilted as in FIG. 6a. The bipod structure 461 geneate the support forces $F_b$ and $F_x$ which compensate the gravity force G/3 by the resulting support force G/3. For the other two bipod structures 462, 463 similar forces $F'_b$ and $F'_x$ and $F''_b$ and $F''_x$ result as reaction forces to compensate the gravitational force G/3 at each of the respective linking points 452, 453. However, since a bipod is usually only or mainly stiff in the tangential and vertical directions, but not or very reduced in radial direction (in order to allow some elasticity for e.g. thermal expansion of the mirror body) the residual force component $F_x$ cannot fully be compensated by an appropriate counter force at the linking point 451 by the bipod 461. For this, the reaction forces $F_{T'}$ and $F_{T'}$ in the tangential (stiff) directions of the other 2 bipods 462, 463 essentially contribute to compensate the force $F_x$. Thus, as the applied force $F_x$ (as seen by the mirror body MB) and the reaction forces $F_{T'}$ and $F_{T'}$ do not coincide at a single point, and also act in different directions, internal deforming stresses are induced into the mirror body MB by these forces, even though they compensate each other in magnitude and direction by vector summation, in order to satisfy the equilibrium condition of rigid body equilibrium. Similar deforming stress forces are also induced by the parasitic forces $F_{x'}$ and $F_{x''}$ due to the tilt against gravity about the y-axis.

The mirror mounting assembly 400 described in FIGS. 4, 5 and 6 not necessarily include actuators in the bipod structures 461, 462, 463 and 461', 462', 463'. If there are no actuators used in the mirror mounting assembly 400 the mirror body MB is passively mounted onto a support structure 480 by the bipod structures 461, 462, 463 and 461', 462', 463' (or any other supporting structure). In general, the support structure 480 may be used as a reference structure. Usually the support structure is used as a reference structure, if the reflective optical element is passively mounted thereon. These bipod structures together with the mirror body MB should have a first eigenfrequency, at its lower spectral end of its eigenfrequency spectrum, of about 300 Hz. To achieve this eigenfrequency the coupling elements 471, 472, 473 (see FIG. 4) which couple the bipod structure to the mirror body MB and to the support structure 480 is sufficiently stiff. Usually these coupling elements are flexure hinges or elastic joints to prevent any over-determinacy of the bearing of the mirror body MB that should be fixed just in 6 degrees of freedom, preferably without or with minimized additional constraints which would result in parasitic forces and moments as shown during the description of FIGS. 4 to 6. Such parasitic forces and moments may result in a deformation of the mirror body or the reflective surface. Since the lowest or the first eigenfrequency in a first approximation is proportional to the square root of the stiffness of the elastic joints (the mirror body has a much higher stiffness than the elastic joints), and it is inverse proportional to the square root of the mass of the mirror body (usually the mirror body has a much higher mass than the bipod or supporting structure), the elastic joints have a certain stiffness such that the system composed of the bipod or supporting structures and the mirror body MB has a sufficient high first eigenfrequency. This high first eigenfrequency reduces any vibration excitation of the mirror body MB, since such mechanical excitations may result in a loss of image quality during the projection process if an object point OP is projected by the projection beam 4 onto an image point IP (see FIG. 1).

In the case that the supporting or bipod structure includes any actuation devices, as e.g. described in connection with FIG. 4, the bandwidth of control loop of the actuator system for the actuated degrees of freedom of the mirror body is be considered. This bandwidth is desirably at least about the same as the lowest eigenfrequency of a passive mounting system which typically has a bandwidth in the range of 300 Hz or above. In this case, the lowest eigenfrequency of the system under active control, wherein the system is composed of the bipod or of supporting structures and the mirror body MB, is desirably well above the high end of the mentioned bandwidth limit of the control loop to prevent any vibration or mechanical excitation of the mirror body. Preferably, the lowest eigenfrequency of the system should be about a factor of 3 to 5 higher than the high end of the bandwidth of the control loop of the actuator system. If Lorentz actuators are used for position control of any degree or freedom the bandwidth for positioning is in the range of about 300 Hz. Thus the first eigenfrequency of the bipod or support structures (including the actuators) together with the mirror body MB should be at about 1.5 kHz or even higher. Such a demand of high first eigenfrequency results in that the elastic joints are much stiffer than in the case of a passively mounted mirror body. As mentioned above the eigenfrequency is in a first order approximation proportional to the square root of the stiffness which results in an about 10 to 25 higher stiffness of the elastic joints, if the eigenfrequency should be increased by a factor of about 3 to 5. This strong increase in stiffness demands for the elastic joints usually will result in a non-ideal kinematic mount of the mirror body with an over-determinacy of forces and/or moments in at least one degree of freedom of the mirror body, resulting in parasitic forces and moments which may deform the mirror body as it is described in FIGS. 5 and 6. This problem increases with increasing mass of the mirror body, meaning with increasing numerical aperture NA of the projection lens 20 of the EUV-lithographic projection exposure system. In this case the stiffness of the elastic joints increase in about the same ratio as the mass of the mirror body MB increases. This again results in higher parasitic forces and moments. Simultaneously, the tolerance limits for deformation of the reflective surface 450, and the tolerance limits for the position accuracy of this surface will become narrower, since with increasing numerical aperture NA the resolution limit shall become smaller. However, this is only possible if the mentioned mechanical tolerances become narrower which is in contradiction to the increasing stiffness and eigenfrequency properties.

As mentioned above, in some embodiments the mirror body MB as shown in FIG. 4 is formed as a support structure such as a mirror table. This mirror table is able to move in up to six degrees of freedom and to carry the mirror or mirror body. The summary of problems which the inventor discussed in connection with FIGS. 4 to 6 may also be of relevance for such a mirror table. Depending on the detailed construction of the mirror table and on the fixation of the mirror body on the mirror table, any distortion of the mirror table may be transferred to the mirror body, and so to the reflective surface of the mirror. Further, in this case usually the mirror body is fixed somehow to this mirror table. In such embodiments the actuation of the mirror table can also be done by electromagnetic linear drives for each coordinate x, y and z, and for the Eulerian angles, as described e.g. in US 2004/0179192 A1. However, any problems of any deformation of the mirror table or the mirror as discussed above is not described in connection with the application of such electromagnetic linear drives which act on a support structure or mirror table which supports the mirror body somehow.

The disclosure provides an alternative mechanical design for a reflective optical element, such as an EUV-mirror or a mirror body for an EUV-lithographic projection exposure system, which is believed to better fulfil the desired mechanical precision.

The improved reflective optical element includes a body with a first reflective surface of a high precision geometrical form for reflecting light in a wavelength range less than 50 nm in an EUV-lithographic projection exposure system. Further, the body includes a first and a second non-reflecting surface, wherein a single connection area is formed on the first non-reflecting surface with at least one fixation surface inside the connection area, which is used for the fixing of the entire optical element in a direct or indirect way to at least one bearing surface of a bearing element. Additionally the second non-reflecting surface is different from the single connection area formed on the first non-reflective surface, and the second non-reflecting surface at least partly surrounds the single connection area. The body further includes at least one stress relief feature, such as a recess, such as e.g. a semicircular recess which is formed into the body. Alternatively or in addition, the stress relief feature may be a curved surface or may include a curved surface with a curvature in the range of 0.1 mm to 10 mm. The stress relief feature, such as the recess and/or the curved surface, at least partly separates the first non-reflective surface from the second non-reflecting surface.

According to the present disclosure, the reflective optical element can also include diffractive structures or grating structures (as used e.g. in encoders and which may include graduations) on its body. The diffractive or grating structures can be arranged on at least one of the non-reflecting surfaces and can be used e.g. for measurement purposes. Additionally or alternative, the diffractive structures can be on the first reflective surface, e.g. for the diffraction of at least parts of the projection beam which is transmitted through the projection lens. As a further alternative or in addition, the diffractive structures are superimposed on a curvature or on the first reflective surface to act as a spectral filter to selectively diffract certain wavelengths of light.

One advantage of the improved reflective optical element according to this disclosure is that the entire optical element is fixable to a bearing element with a single or sole connection area. Ideally, this connection area could be imagined as just one point, as a mounting point, in which the entire mirror is supported or is suspended by a bearing element. This has the advantage that at least the problems regarding different thermal or mechanical expansion of the optical element (e.g. the mirror body MB and the support element 480—see FIG. 4) ideally will not result in any deformation as described above in connection with a kinematic mounting, such as a mounting with the described three bipod structures, as described in connection with FIGS. 4 to 6, in which the optical element is supported (or suspended) by three mounting points 451 to 453, resulting in the explained parasitic forces and torques or moments due to a displacement of the bipod structures in the case of the mentioned different thermal or mechanical expansion. Additionally, also any temperature gradients between the reflective optical element and its support element (or support structure) causes also no parasitic forces and moments as it is if the above described kinematic mounting according to FIGS. 4 to 6 is applied. Since the mounting of the entire optical element on just one or a single point is technically not possible, in practice, for the improved optical element a single connection area is used. This area shall behave within given tolerances such as a one or single point mounting. However, the connection area itself can have more than one fixation surfaces which can be connected to at least one bearing surface of a bearing element. To estimate the dimension or value of the connection area (without taking into account the stiffness of the connection itself for a first guess) it can be started from a 3-point kinematic mounting as described with FIGS. 4 to 6. There the (shortest) distance of the three mounting points 451 to 453 gives a value Dk. This value Dk usually is in the range of about half of the dimension of the mirror. If there is a different thermal or mechanical expansion of the reflective optical element 421 and the support structure 480, which occur during the usage of the elements in the projection process, the parasitic forces and moments theoretically can be reduced by reducing the distance Dk of the mounting points. So if these parasitic effects shall be reduced by a factor of 5 it is desirable to reduce the distance Dk to a value of about Dk/5. In practice, this is not possible due to installation space which is desired for the three bipod elements. By the usage of the improved optical element, the connection area with a dimension of about Dk/5 could reduce the parasitic forces and torques at about the same value. For this reason, as a rule, the connection area should be in a selected direction smaller than about 1/10 of the dimension of the optical element in the respective direction. This rule results in that the connection area should be smaller than 1/100 of the largest cross section area of the optical element. With this rule, there is a good chance to reduce the parasitic forces and moments at least by a significant amount. This can be made clear by the example of a beam. The bending deflection of a simple beam scales to the length of the beam to the power of 3. There is a similar behaviour for the mirror body MB, but, contrary to the beam, the complex geometry of the mirror body have to be considered, resulting in deviations from the simple "power of 3"-relation with respect to a mirror dimension.

An additional advantage of the improved optical element is that the single connection area within the first non-reflective surface is at least partly separated from the second non-reflective area by the at least one stress relief feature, such as a recess, which is formed into the body. This allows a further decoupling of forces and moments from the first to the second non-reflecting surface. The result is that the forces and torques are not fully transferred into the material of the optical element body which is covered by the second non-reflective surface. For this reason the second non-reflective surface will not be deformed or will only be deformed in a reduced way, if forces or torques act onto the first non-reflective surface, especially if these forces or toques are similar to the above mentioned parasitic ones. Further, the at least one stress relief recess also reduces any aging effects of the connection of the fixation surface and the bearing surface of the bearing element. Especially, if the connection is done by glue, since usually the stress and hence any deformation due to glue shrinkage changes over the time. For this, also any parasitic deformations, resulting from the connection itself, are reduced or are prevented from having a direct impact on the form of the functional optical surface.

The reflective optical element in accordance to the present disclosure allows to fix an optical element within an projection lens 20 of an EUV-lithographic exposure projection system such that the surface deformation of the reflective surface, for reflecting light with a wavelength in the spectral range less than 50 nm, preferably in the range between 5 nm and 50 nm, is within one of the tolerance ranges selected from the group of tolerances consisting of 0.5 nm to 1 nm, 0.2 nm to 0.5 nm, 0.1 nm to 0.3 nm, 0.05 nm to 0.25 nm, 0.1 nm to 0.7 nm.

The mentioned surface deformation limits is achieved over a distance from about 20% of the diameter of the first reflective surface of the improved reflective optical element or mirror up to its diameter. In general, if the reflective surface is not rotational symmetric, the diamter is replaced by the mirror dimension in one direction. If the reflective optical element is actuated by a control loop, at least the position and/or the orientation and/or any deformation of the reflective surface of the reflective optical element is within these very tight tolerance limits, meaning that any misplacement of the reflective surface of the reflective optical element should be within these limits. These deformation and position limits correct the lowest order imaging errors. Higher order imaging errors usually cannot be corrected with the mentioned surface positioning and surface deformation, because they are a result of the surface roughness of the reflective surface which is in the range of less than 100 pm (picometer) for an RMS-value which is averaged from about 10 mm to about 100 nm.

A fixation of an EUV-mirror in such a way that any surface deformation is within such narrow tolerances can be achieved with the improved reflective optical element of this disclosure, especially if the mirrors have higher masses or larger effective or usable reflective surfaces which are used to project an object point to an image point. Such mirrors are used in projection lenses of EUV-lithographic projection exposure systems with a numerical aperture NA of higher than 0.25, or of a NA in the range between 0.26 and 0.40, or in the range between 0.30 and 0.50 and in the range of 0.4 and 0.7. For such high-NA projection lenses it is desirable for at least one mirror to have a dimension of the effective reflective surface of more than 250 mm in at least one direction. If the numerical aperture NA increases above 0.30 the effective surface of at least one mirror of the projection lens has a dimension of the effective reflective surface of more than 300 mm in at least one direction. With these desired properties, the mirrors become more and more massive. The present improved reflective optical element according to this disclosure may be used up to mirrors with a dimension of the effective reflective surface of 800 mm in at least one direction, why the improved reflective optical element is very important for the next generation of EUV projection lenses. Therefore, the present disclosure especially is valuable for EUV-lithographic projection exposure systems which include a projection lens (to project an object field on a structured object onto an image field on a substrate), wherein the numerical aperture of the projection lens on the image field is in the range of 0.26 to 0.70, and wherein the projection lens includes at least one mirror with an effective reflective surface dimension larger than 500 mm. In one embodiment a mirror with a surface dimension in the range of 300 mm to 800 mm for the reflective surface is passively mounted to a support structure. Further, the such passively mounted mirror includes the features of the improved reflective optical element in accordance to an embodiment of the present disclosure, especially the embodiment as described above.

In one embodiment of the improved reflective optical element the single connection area is arranged on a side of the body which is about opposite of the first reflecting surface. This has the advantage that the reflective surface area can be maximized on the body of the reflective optical element. A further advantage is that any surface deformation of the reflective surface, caused by the connection with the bearing element or caused by any misalignment of the optical element or by any thermal effects, are reduced, since the connection area has a certain distance to the reflective surface. This embodiment is also advantageous if the optical element is supported or suspended at the single connection area by a bearing element, because the bearing element in this arrangement is about opposite of the reflective surface. Usually there is much more installation space for the bearing element. Additionally there is not the problem that the bearing element will partly shadow the first reflective optical surface.

However, alternatively to the last embodiment it is also possible to arrange the connection area on the side of the body with the reflective surface, or on the side which includes the reflective surface. In this case, the advantages just mentioned before are most probably lost or reduced, depending on the spatial position of the reflective optical element relative to the projection beam which passes to projection lens to image an object point to an image point.

In a further embodiment of the improved reflective optical element the second non-reflecting surface surrounds the single connection area. This makes the stress relief from the first to the second non-reflective area more efficient. This stress relief is most efficient if in a further embodiment the at least one stress relief recess separates the single connection area from the second non-reflecting surface.

In a preferred embodiment the improved reflective optical element is fixed to the bearing element in a predetermined spatial position such that the line of force of the gravitational force of the entire optical element, effecting on the centre of gravity of the optical element, crosses the single connection area or crosses the connection area at its geometrical centre. In such an embodiment, the stress distribution over the connection area is largely uniform and in any case axialsymmetric, thus reducing any parasitic forces and moments, and also thus the resulting deformations of the reflective optical element are reduced to a minimum.

Parasitic forces in this disclosure are forces with force components in a direction different from the direction of the gravitational force, which are the mentioned reaction (counter) forces. The parasitic moments are torques which are caused by the parasitic forces, or by parasitic stiffnesses of flexures of bipods, and act onto the body of the reflective optical element. The at least one fixation surface and the at least one bearing surface are at least partly in direct and/or indirect contact to each other to fix the optical element in the predetermined spatial position with a resultant bearing force that is generating no torques or moments with respect to the centre of gravity of the entire optical element. Thus, any deformation of the reflective optical element can be efficiently reduced. Preferably but not necessarily the connection area is a plane area. In a further preferred embodiment the single connection area is arranged such that in the working position of the reflective optical element within the projection lens the plane connection area is perpendicular to the line of force of the gravitational force within an accuracy of ±1 mrad (±$10^{-3}$ rad). In this case the bearing surface of the bearing element is also a plane area parallel to the connection area. In an alternative embodiment the single connection area is of curved shape, wherein the area is curved in at least one direction, and wherein the connection area is symmetrically arranged with respect to line of force of the gravitational force if the optical element is positioned in its working position within the projection lens. Without limitation, such a connection area can have e.g. the shape of shell of a part of a cylinder, a sphere or a cone. Further, the connection area also can have the shape of a polyhedron. Advantageously, the polyhedron is arranges symmetrically to the line of force of the gravitational force, and in addition the arrangement is such that its apex or one of its corners is arranged on this line. Also with such shapes of the connection area the parasitic forces and torques are significantly reduced due to the symmetry of the connection area relative to the line of force of the gravitational force, which acts on the centre of mass of the entire reflective optical element. In the last cases where the shape of the connection area differs from the one of a plane, the shape of the bearing surface advantageously is of negative shape of the shape of the connection area. As an example, if the connection area is cone shaped protrusion then the bearing surface is a cone shaped recess such that at least parts of the protrusion fit into the recess. If in the other case the connection area is a cone shaped recess then the bearing surface is a cone shaped protrusion so that at least parts of this protrusion fit into the recess.

Further, in preferred embodiment the reflective optical element according to the present disclosure is rigidly fixed to the bearing element. The rigid fixation is important because the degree of stiffness of the rigid fixation or connection to the bearing element will influence the lowest eigenfrequency of the reflective optical element, or the lowest eigenfrequency of the system consisting of or including the reflective optical element and the bearing element. If the stiffness is too low then the lowest eigenfrequency of the reflective optical element is too low such that the element could be maladjusted due to activation or beginning activation of the low eigenfrequency mode. High stiffness can be achieved by the choice of materials with a very high elastic modulus or Young's modulus, preferably higher than 50 GPa, and/or by the shape of the connection area, which results in respective geometrical moments of inertia which determine the stiffness regarding lengthening, torsion and bending. Connections of such high elastic modulus can be achieved e.g. if the connection area with its at least one fixation surface is abutted to the bearing surface of the bearing element, e.g. by wringing, and if the materials of the reflective optical element and the bearing element are e.g. glass ceramics such as Zerodur®, or e.g. titania silicate glass such as ULE®. Preferably, the wringing connection is secured by a glue connection as e.g. described in US 2006/0192328 A1. In an alternative embodiment of the present disclosure the connection is done by a glue between the bearing surface and the at least one fixation surface such that the glue forms a boundary layer between these surfaces. The used glues have typically Young's moduli of about 6 GPa, and a thickness in the range of 10 µm to 100 µm. In such connections, the lowest eigenfrequency is mainly determined by the stiffness of the glue connection whose stiffness can be adjusted by the size and the form of the area of the glue connection, and also by the thickness of the glue layer.

In general, the rigid fixation of the reflective optical element to the bearing element can be done by an adhesive bond or a metallic continuity bond and/or a form fit bond by bringing the connection area in direct or indirect contact with a bearing surface of the bearing element. A bond with a force closure is also possible but less preferred, since a force closure has the risk to generate parasitic forces and moments which can cause a deformation of the first reflective surface of the improved reflective optical element.

In a further embodiment of the present disclosure the bearing element includes at least one actuation device to actuate the bearing element in at least one degree of freedom. Additionally or alternatively, the bearing element can be deformed by an actuation device.

In a further embodiment of the improved optical element according to the present disclosure the single or sole connection area is formed integrally as a first connection element to the body of the reflective optical element. Preferably, the first connection element forms a projection on the body of the reflective optical element such as a pillar or a stud. However, the first connection element also can be a recess in the surface of the body. In the case of a projection, the body can easily be fixed to a flat bearing surface of the bearing element, such as a plane bearing surface. Further, due to the integral formation of the first connection element, there is only one connection involved to connect the body with the bearing element. Additionally, the mirror body is not mechanically degraded in the range of the single connection area which results in a high stiffness in this range. Alternatively, if the first connection element is a recess in the surface of the body, the bearing element may include a projection on its surface. The bearing surface is arranged at the distal end or free end of this projection. This projection with the bearing surface then is connected with the first connection element in such a way that at least a part of the projection of the bearing element is inserted into the recess of the body where the bearing surface is connected to the connection area. As an additional alternative embodiment of the present disclosure, both, the body of the optical element and the bearing element include a projection. The contact area with the fixation surface is at the distal or free end of the projection of the body, and vice versa, the bearing surface is also at the distal or free end of the projection of the bearing element. Both distal ends of the respective projection are connected such that the reflective optical element is fixed to the bearing element. In the last two embodiments the bearing surface is arranged on a second connection element which forms a projection, being part of the bearing element. In the embodiments up to now the projections are integrally formed to the respective elements, the body and/or the bearing element. In these cases the reflective optical element is fixed to the bearing element as one monolithic element. However, in other embodiments the projections are not integrally formed to these elements. In such embodiments a bolt, pillar or stud is connected with one of its free distal ends to the single connection area of the body of the reflective optical element, and with the other free distal end it is connected to the bearing surface of the bearing element. In these embodiments the body of the reflective optical element is not directly fixed to the support element but indirectly by the bolt, pillar or stud. This connection involves two connections, one at each free distal end of the bolt, pillar or stud.

In most embodiments of the improved reflective optical element of the present disclosure the first reflective surface of the optical element includes a curved area which is curved along at least one direction. The curved area can be concave or convex. It can also have a rotational symmetry. However, the symmetry axis is not necessarily within the reflective area, it also can be outside, even outside the mirror body. The curved area of the first reflective surface can be e.g. of spherical, cylindrical or aspherical form. Further, the curved area can have the shape of a free-form shape.

Further embodiments of the improved reflective optical element in accordance to the present disclosure include a second reflective surface and/or a grating on the body or the first connection element. This second reflective surface and/or the grating is used e.g. for metrology, e.g. to determine the position and/or orientation of the first reflective surface of the optical element in at least one degree of freedom, and or to determine any deformation of the body and/or the first reflective surface. Alternatively or in addition, the reflective optical element according to the present disclosure is fixed to a bearing element that includes a third reflective surface and/or a grating. The third reflective surface and/or the grating is arranged on the support element or the second connection element. This third reflective surface and/or this grating is used also e.g. for metrology, e.g. to determine the position and/or orientation of the support element in at least one degree of freedom, and/or to determine any deformation of the support element. In addition, any deformation of the first and/or second connection elements or any change in the relative position of the body of the reflective optical element and the support element can be measured if the second and/or third reflective optical surfaces and/or gratings are suitably arranged. Of course, also in embodiments in which the reflective optical element is indirectly fixed to the support element, the bolt, pillar or stud may also include an additional (second or third) reflective surface and/or a grating for metrology applications.

Further features and advantages of the present disclosure and further improvements will become apparent from the following detailed description of exemplary embodiments with reference to the following drawings. However, the following description of the disclosure by exemplary embodiments is merely illustrative and in no way intended to limit the disclosure and its applications. As shown above, features of different embodiments can be exchanged and/or combined to get additional embodiments of the reflective optical element in accordance to the present disclosure, which also holds for the following exemplary embodiments.

BRIEF DESCRIPTION OF THE DRAWINGS

In the drawings:

FIG. 5a schematically shows a side view of elements of the mirror mounting assembly of FIG. 4 in a xz-plane along the x-axis or along the c-c-line shown in FIG. 4;

FIG. 5b schematically shows a side view of elements of the mirror mounting assembly of FIG. 4 in a xz-plane along the x-axis or along the c-c-line shown in FIG. 4, in which the mirror body is slightly distorted due to misalignment of bipods;

FIG. 5c schematically shows a top view of elements of the mirror mounting assembly of FIG. 4 in a xy-plane;

FIG. 6a schematically shows a side view of elements of the mirror mounting assembly of FIG. 4 in a xz-plane along the x-axis or along the c-c-line shown in FIG. 4, but the mirror body MB is tilted about the y-axis relative to the gravitational force direction by an angle β;

FIG. 6b schematically shows a top view of elements of the mirror mounting assembly as shown in FIG. 6a;

FIGS. 8a to 8e schematically show various embodiments of the disclosure with various arrangements of the connection area relative to the reflective surface of the reflective optical element;

DETAILED DESCRIPTION

Figure 4:
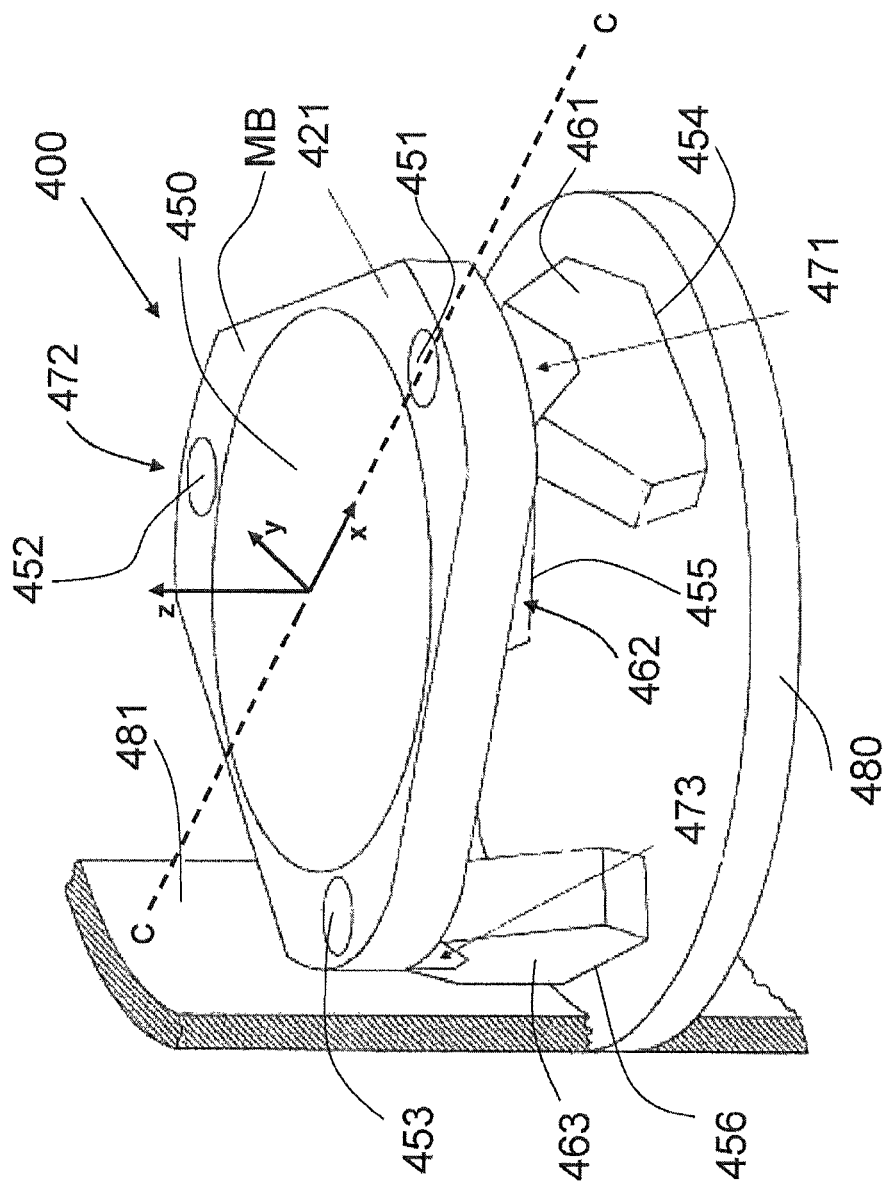
FIG. 4 schematically shows a mirror mounting assembly with a mirror as used in an EUV-lithographic projection exposure system as described in e.g. in WO 2005/026801 A2.
Figure 7A:
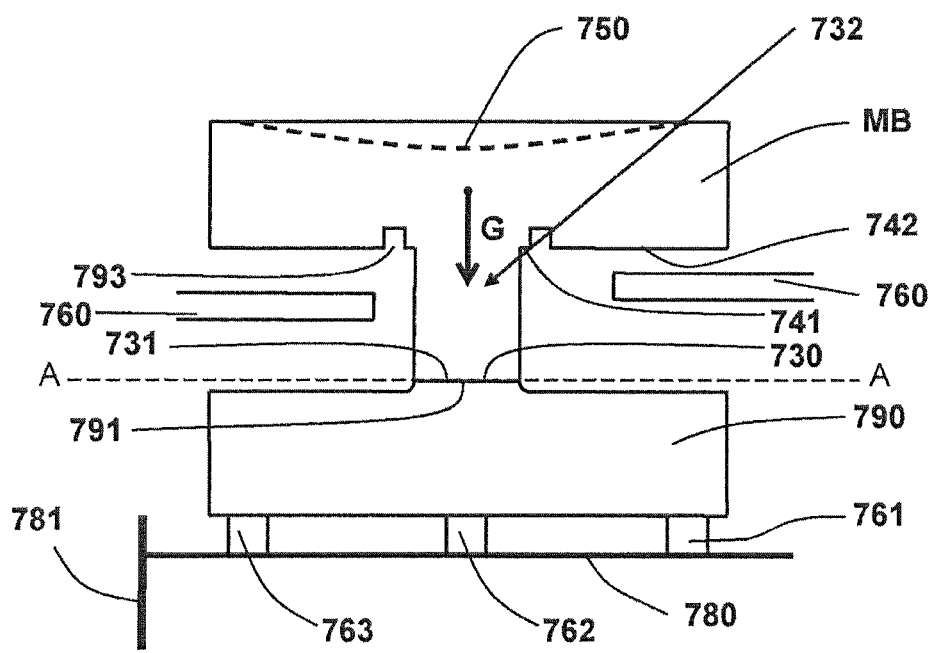
FIGS. 7a and 7b schematically show a side view and a bottom view of a reflective optical element such as an EUV-mirror according a first embodiment of the disclosure.
Figure 7B:
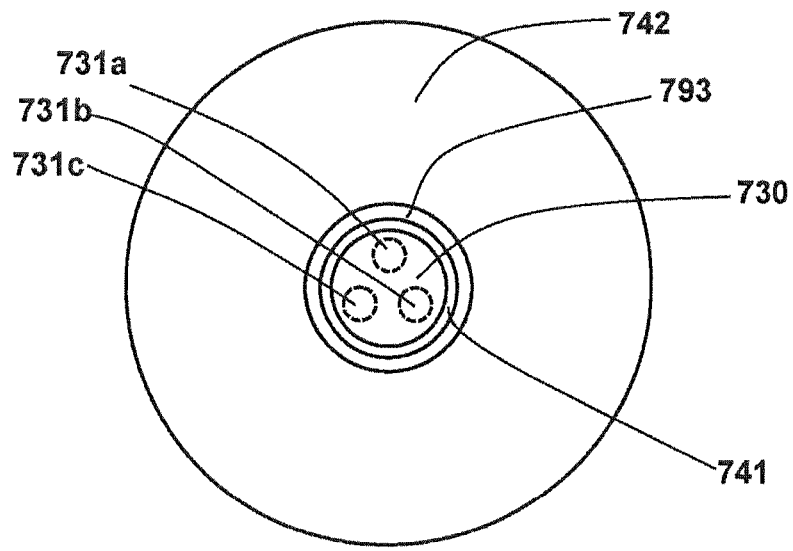

FIG. 7a schematically shows a side view of a reflective optical element, such as an EUV-mirror according a first embodiment of the disclosure. FIG. 7b shows the reflective optical element in a sectional view along the line A-A from the backside which is opposite to the reflective surface 750. In FIG. 7a, b the same elements as shown in FIGS. 4 to 6 are designated with the same reference numerals but added by an offset of 300.

Figure 1:
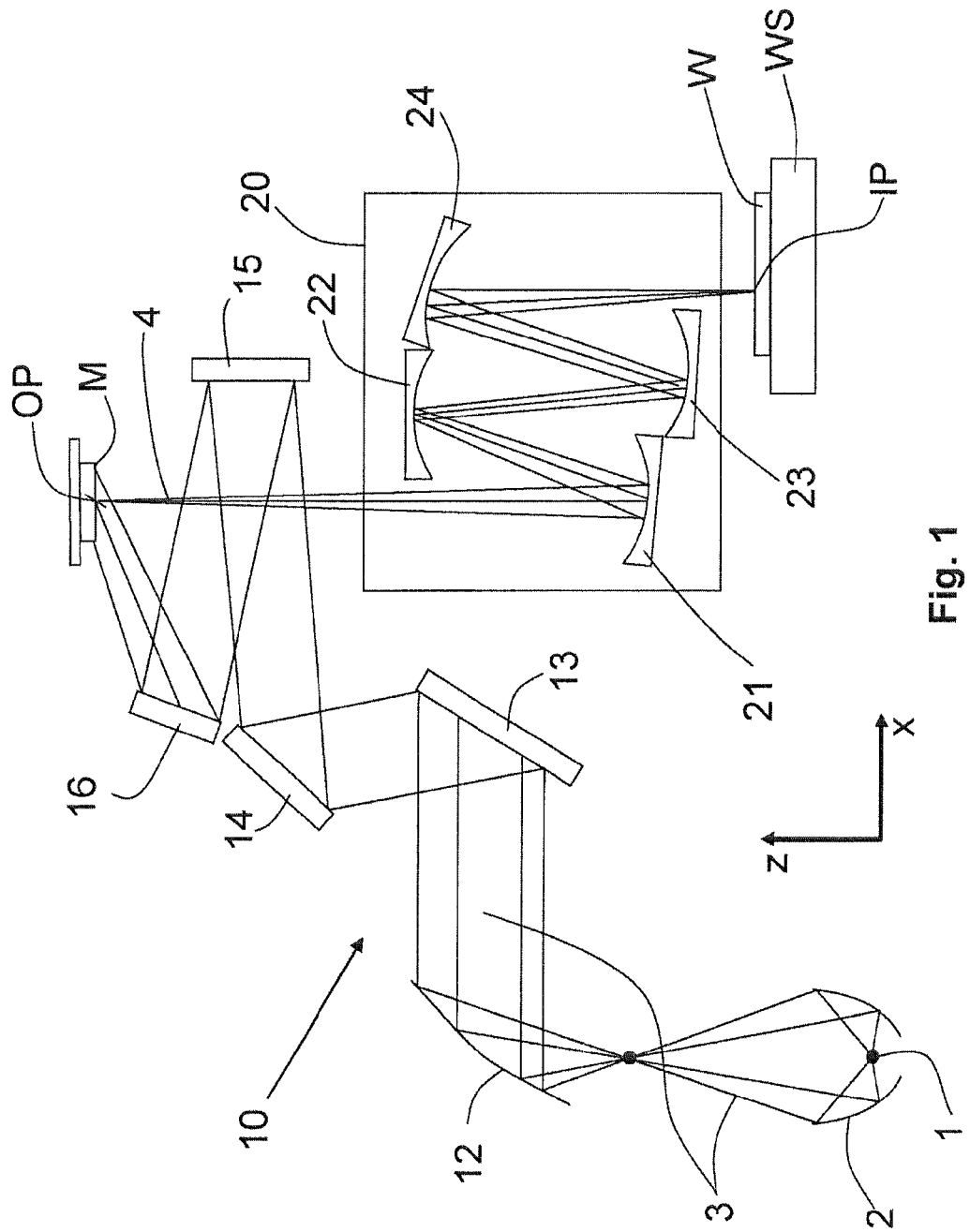
FIG. 1 schematically shows a simplified EUV lithographic projection exposure system.
Figure 2:
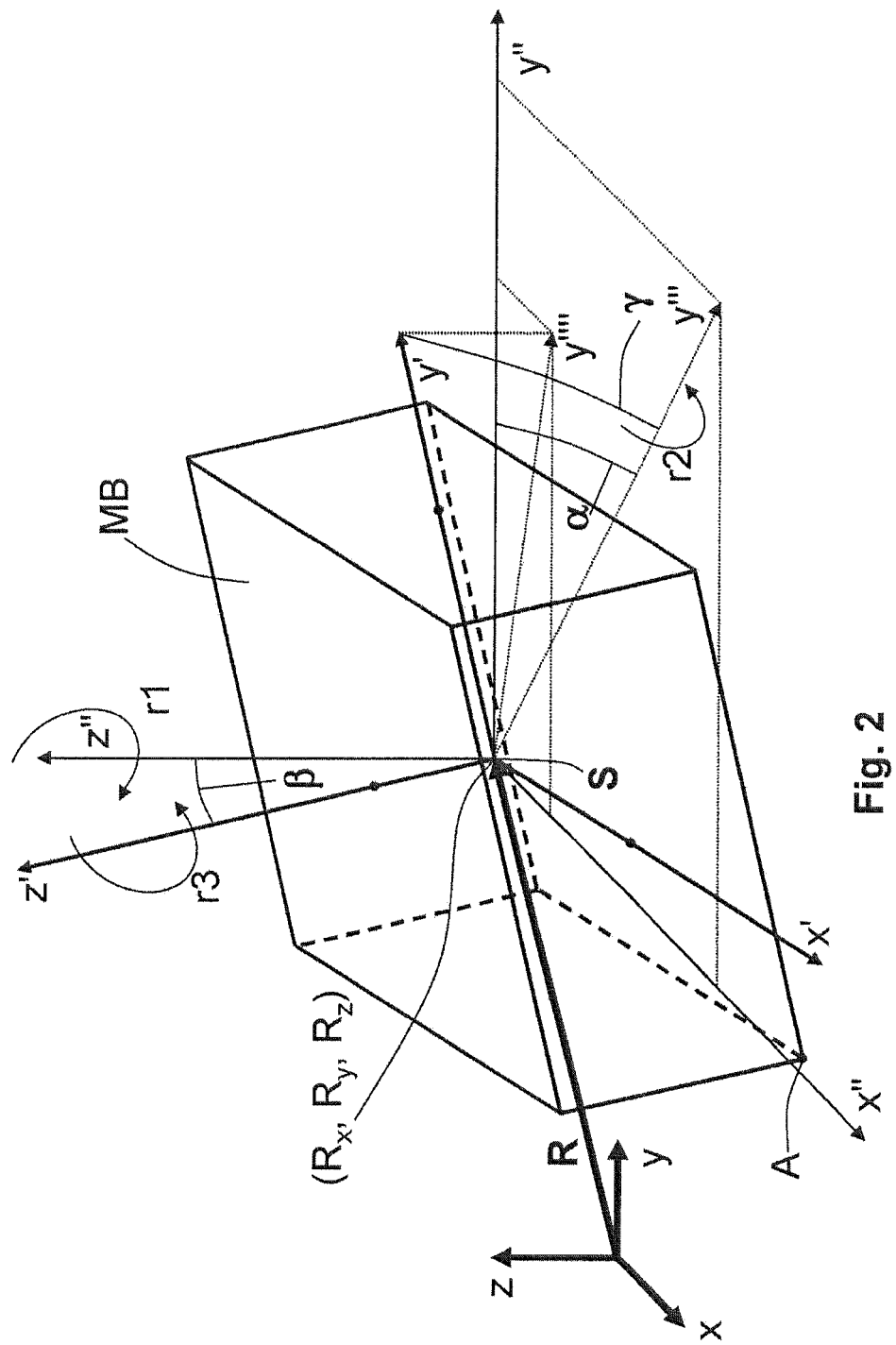
FIG. 2 schematically shows a mirror body in a reference coordinate system and with a coordinate system fixed to the mirror body.
Figure 3:
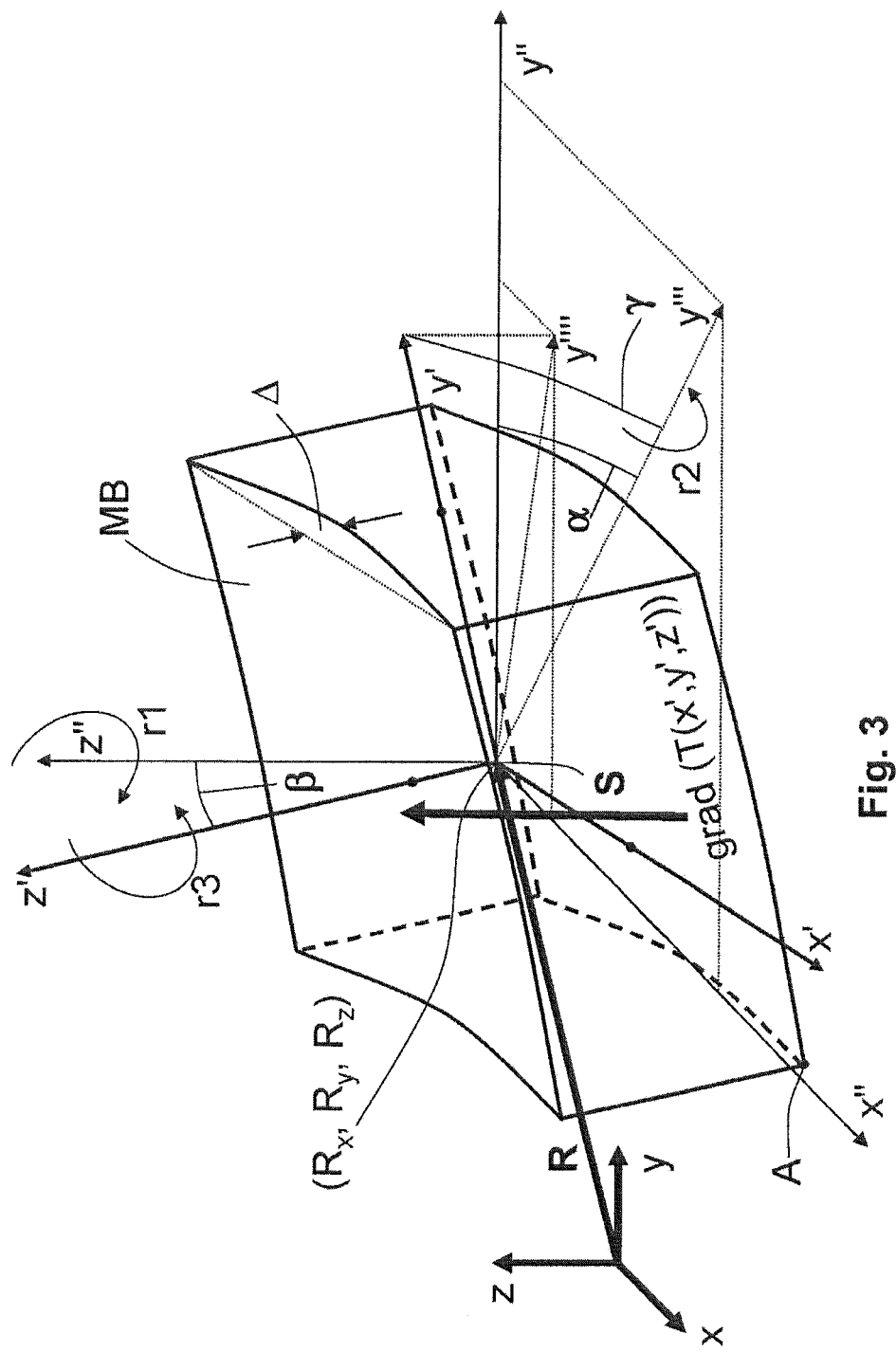
FIG. 3 shows the mirror of FIG. 2 with a deformed reflective surface.

The optical element includes a body, e.g. a mirror body MB and at least one first reflective surface 750 with the precision properties as described in connection with the previous FIGS. 4 to 6. The reflective surface 750 is of high mechanical precision regarding its geometrical form or surface figure and/or regarding its roughness. Further, the reflective surface 750 may include any coatings. The reflective surface 750 is made such and it is oriented relative to the projection light beam 4 of an EUV-lithographic projection exposure system such that the reflected light, with e.g. a wavelength in the spectral range of less than 50 nm, is usually reflected with a reflectivity of more than 50%. Further, the mirror body MB includes a first and a second non-reflective surface 741, 742. The mirror body MB further includes a single or sole connection area 730 which is formed on the first non-reflection surface 741. The connection area 730 includes at least one fixation surface 731 inside the connection area 730 for direct or indirect fixation of the entire body MB of the reflective optical element to at least one bearing surface 791 of a bearing element 790. The bearing element 790 may be a support structure such as a mirror table which is mechanically connected in a direct way to the housing structure 781 of the projection lens 20 (FIG. 1), or which is connected in an indirect way to the housing structure 781 by a further support structure 780 as shown in FIG. 7a.

The body MB of the reflective optical element further includes at least one stress relief feature 793 formed into the body MB. In the shown embodiment, the stress relief feature is a recess. The recess may be of semicircular shape or it may include a semicircular recess. Alternatively or in addition, the stress relief feature may be or may include a curved surface with a curvature in the range of 0.1 mm to 10 mm as it is schematically shown in FIG. 9c with reference numeral 793. Additionally, the stress relief feature 793 at least partly separates the first non-reflective surface 741 from the second non-reflective surface 742 as it can be seen as an example in FIG. 7b.

Due to the single connection area 730 any parasitic forces or moments, resulting from different expansions of the bearing element 790 and the mirror body MB of the reflective optical element, are significantly reduced, as it was already described above. Further, also in the case that there is any displacement of the bearing element 790 and/or the mirror body MB, the resulting parasitic forces and moments are additional reduced regarding their effect to any deformation of the reflective surface 750, since due to the stress relief recess 793 they mainly act on the region of the single connection area and/or the first non-reflective surface. This stress relief recess at least partly separates the first non-reflective surface 741 form the second non-reflective surface 742, and the second non-reflective surface mainly includes the surface of the body MB which is about opposite of the reflective surface 750 except a surface region which includes the connection area 730. Thus, any parasitic forces and moments essentially can only make an effect within the region of the first non-reflective surface 741, which is usually small in comparison with the second non-reflective surface 742. As already mentioned, the first non-reflective surface area is smaller than about 1/100 of the largest cross-section area of the reflective optical element. In a good approximation, the first non-reflective area 741 is smaller than 1/100 of the second non-reflective area 742. This results in that the largest part of the mirror body MB is not influenced by the parasitic forces and/or moments. Therefore, also the reflective surface 750 of the mirror is almost free of any distortion. Without loss of generality, in FIG. 7a, b the body MB of the mirror has an about cylindrical shape and a circular cross-section. Further, the connection area 730 and large parts of the first non-reflective surface 741 form a protrusion-like first connection element 732 such as a pillar or a stud. In addition, in the shown embodiment this first connection element 732 is integrally formed with the mirror body MB. The stress relief recess 793 in the shown example surrounds the first connection element 732 and it is formed as a ring-shaped channel.

The single connection area 730 can be a plane-shaped surface as shown in FIG. 7a, b, and such as at least one fixation surface inside the connection area 730 may cover almost this area in a way that the mirror body is fixed to the bearing element 790 with just one surface—the fixation surface 731. For the fixation of the mirror body MB on the bearing element 790 a glue may be used. In this case the mirror body MB is indirectly fixed to the bearing element 790 due to the glue layer between the fixation surface 731 and the bearing surface 791 of the bearing element 790.

Alternatively, the single connection area 730 may include more than one fixation surface, the e.g. three fixation surfaces 731a, 731b and 731c as shown by the dotted lines in FIG. 7b. These fixation surfaces may also be formed by surface regions which are covered with a glue. In this case not the complete connection area 730 is covered by a glue.

As already mentioned, the area which is covered by a glue and which fixes the mirror body MB at the bearing element 790 also influences the lowest eigenfrequency of the system consisting of the mirror body MB, the glue and the bearing element 790. For this reason, in some embodiments of the disclosure the lowest eigenfrequency of the system may be adjusted with the glue parameters, such as surface area which is covered by the glue and the glue thickness. In such embodiments more than one fixation surface 731a, 731b, 731c within the connection area 730 can be used with advantage to adjust the lowest eigenfrequency of the system.

Figure 7C:
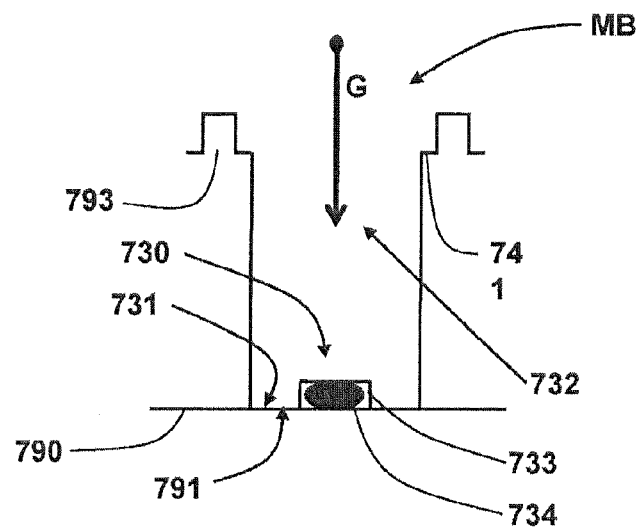
FIGS. 7c to 7e schematically show in more detail a section of the single connection area of FIG. 7a and FIG. 7b.

FIG. 7c shows in a more detail a section of the single connection area 730 of FIG. 7a, b with the first connection element 732 and the stress relief recess 793 in which the single connection area 730 includes a structure. The structure is forming at least one recess 733 into the single connection area 730 such that there is no direct contact to the bearing surface 791 of the bearing element 790 in the area where the recess 733 is arranged. The recess 733 may be at least partly filled with a glue 734. However, nearby the recess 733 at least one fixation surface 731 is formed within the connection area 730. The at least one fixation surface 731 directly contacts the bearing surface 791. The glue 734 in the recess 733 connects the bearing surface 791 of the bearing element 790 and the connection area 730 by adhesive bond. Optionally the fixation surface 731 and the bearing surface 791 may be wrung together, and the glue 734 in the recess 733 just secures the wring connection such that in the case of any unfixing of the wring connection both elements are kept together. In such embodiments with a wring connection the first eigenfrequency of the reflective optical element and the bearing element 790 is not influenced by the glue and the mentioned glue parameters.

Figures 7D, 7E:
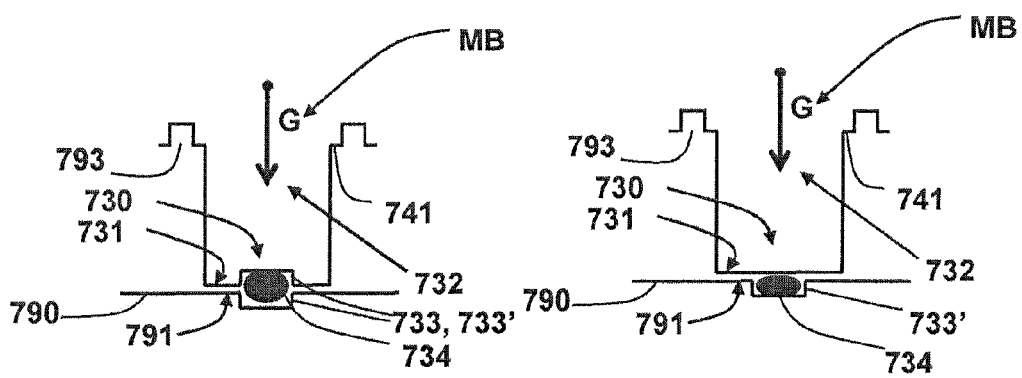

In addition and/or alternative in a further embodiment at least one recess 733', similar to the above described recess 733 in the connection area 730, may be formed into the bearing surface 791 of the bearing element 790, as it is shown in FIG. 7d and FIG. 7e. The recess 733' may also include a glue to form an adhesive connection between the connection area 730 of the reflective optical element and the bearing element 790.

In further embodiments of the disclosure the wring connection and/or the adhesive bonds with a glue may be replaced or supplemented by other adhesive bonds, such as solder connections or welding connections. Preferably, laser welding or laser soldering is applied to form the respective adhesive bonds.

In the embodiments as shown in FIG. 7a to FIG. 7e the single connection area 730 is arranged on a side of the body MB of the reflective optical element which is about opposite of the first reflecting surface 750. This has the advantage that the reflective surface area 750 can be maximized on the body MB of the reflective optical element. Additionally, any surface deformation of the reflective surface 750, caused by the connection with the bearing element 790, or caused by any misalignment of the optical element or by any thermal effects, is reduced because the connection area 730 has a certain distance to the reflective surface 750. A further advantage is that if the optical element is supported or suspended at the single connection area 730 by a bearing element 790, the bearing element 790 in these arrangements is about opposite of the reflective surface 750 where usually much more installation space is available for the bearing element 790. Additionally, the bearing element will not partly shadow the first reflective optical surface.

However, in FIG. 8a to FIG. 8c alternative embodiments of the disclosures are shown, in which the single connection area 730 is not arranged about opposite to the first reflective area 750. The same elements are designated with the same reference numerals as in FIG. 7a to FIG. 7e. In FIG. 8a an alternative embodiment is schematically shown, in which the single connection area 730 is arranged on a side of the mirror body MB. In this embodiment the reflective optical element is arranged such that the gravitational force G is about parallel to a tangent T through an apex A of the reflective surface 750 of the reflective optical element. The single connection area 730 is arranged such that it is crossed by the line of force L of the gravitational force G which also crosses the centre of mass S of the reflective optical element.

In FIG. 8b the single connection area 730 is also arranged on a side of the reflective optical element. However, the tangent T through the apex A of the reflective surface 750 of the reflective optical element forms an angle with the line of force L of the gravitational force G which also crosses the centre of mass S of the optical element. In this case, the single connection area 730 is also arranged such that it is crossed by the line of force L of the gravitational force G.

FIG. 8c schematically shows a further embodiment of the inventive reflective optical element in which the single connection area 730 is arranged on the side of the body MB on which the reflective surface 750 is arranged. Similar to the previous embodiments the single connection area 730 is arranged such that it is crossed by the line of force L of the gravitational force G which also crosses the centre of mass S of the reflective optical element. In this embodiment of the disclosure a reflective optical element includes a body MB with a first reflective surface 750 of a high precision geometrical form for reflecting light in a wavelength range less than 50 nm in an EUV-lithographic projection exposure system. Further, the body MB includes a first non-reflecting surface 741 and a single connection area 730 formed on the first non-reflecting surface 741 with at least one fixation surface inside the connection area 730 for fixing the entire optical element directly or indirectly to at least one bearing surface 791 of a bearing element 790 (not shown in FIG. 8c). In addition at least one stress relief recess 793 is formed into the body MB, and the stress relief recess at least partly separates the first non-reflective surface 741 from the first reflective surface 750.

FIG. 8d schematically shows a further embodiment of the disclosure, in which the mirror body MB includes a connection area which is about opposite to the first reflection surface 750, as it is in FIGS. 7a to 7e. However, the tangent T through the apex of the reflective surface 750 of the reflective optical element forms an angle different of 90° or 0° with the line of force L of the gravitational force G which also crosses the centre of mass S of the optical element. Also, in this case the single connection area 730 is arranged such that it is crossed by the line of force L of the gravitational force G. In the case of a plane connection area 730, the connection area 730 is preferably arranged under an angle of 90° to the line of force L. In the example as shown in FIG. 8d the reflective optical element is supported by the connection area 730 if this area is connected to a support or bearing element which is not shown.

FIG. 8e schematically shows a similar embodiment as shown in FIG. 8d, but there the reflective optical element is arranged such, that it is suspended by the connection area if this area is connected to a respective bearing element (not shown), which can be seen from the direction of the gravitational force G.

In the reflective optical elements in accordance with this disclosure, which are shown in FIGS. 7 and 8, the reflective optical element is fixed to the bearing element 790 in a predetermined spatial position. In this position the line of force L of the gravitational force G of the entire optical element, affecting on the centre of gravity S of the optical element, crosses the single connection area 730. Thus, parasitic forces and torques or moments are advantageously reduced, which are caused by the gravitational force of the reflective optical element, or which are caused by the respective counterforces and countermoments which are generated by the bearing element and which act onto the single connection area 730. Preferably, the connection area 730 is a plane area as shown in the embodiments of FIGS. 7 and 8. Additionally, the single connection area 730 is arranged such that in the operation position of the optical element within the projection lens the connection of the plane connection area 730 to the bearing surface 791 of the bearing element 790 is perpendicular to the line of force L of the gravitational force within an accuracy of $\pm 1$ mrad ($\pm 10^{-3}$ rad).

Figure 9A:
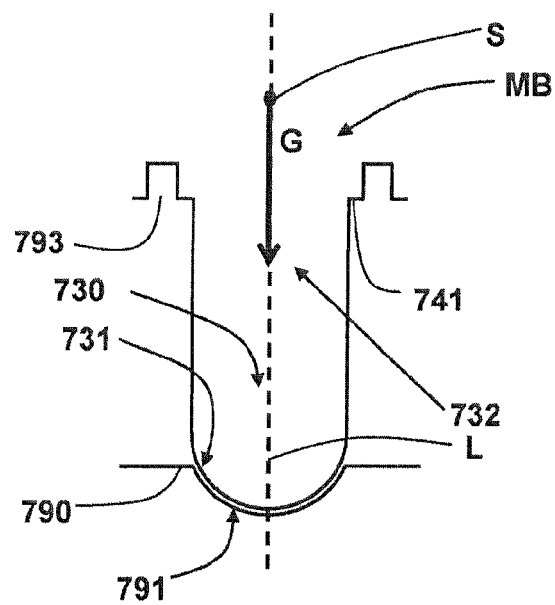
FIGS. 9a to 9c schematically show various shapes of the connection area of the reflective optical element in accordance to the present disclosure.
Figures 9B, 9C:
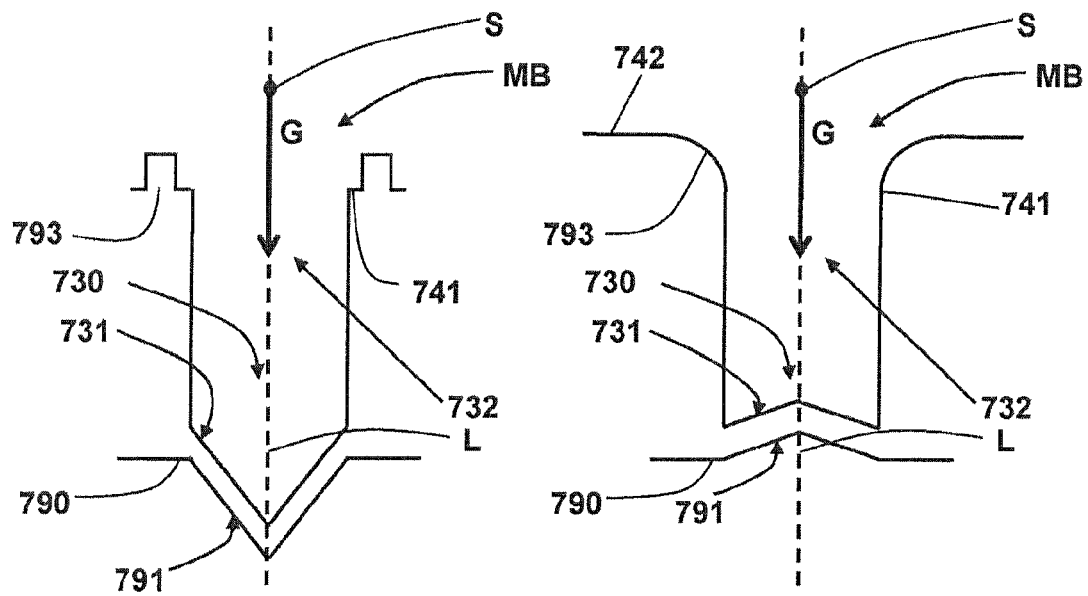

In an alternative embodiment, as schematically shown in FIG. 9a which shows a section of the alternative first connection element 732 of FIG. 7a, the single connection area 730 includes a curved shape area, wherein this area is curved in at least one direction, and wherein the connection area 730 is symmetrically arranged with respect to line of force L of the gravitational force G, if the optical element is positioned in its working or operation position within the projection lens. Without limitation such a connection area 730 can have e.g. the shape of shell of a part of a cylinder, a sphere or a cone.

Further, the connection area 730 also can have the shape of a polyhedron as it is schematically shown in FIG. 9b which shows a section of such an alternative first connection element 732 of FIG. 7a. Advantageously, the polyhedron is arranged symmetrically to the line of force L of the gravitational force G, and in addition the arrangement is such that its apex or one of its corners is arranged on this line L.

With such alternative shapes of the connection area 730 and the respective fixation surfaces 731 the parasitic forces and torques are also significantly reduced. This is due to the symmetry of the connection area 730 relative to the line of force L of the gravitational force G which acts on the centre of mass S of the entire reflective optical element in its working position within the projection lens. In the last cases where the shape of the connection area differs from the one of a plane, the shape of the bearing surface 791 advantageously is of negative shape of the one of the connection area 730, as it is shown in FIG. 9a and FIG. 9b. As an example, if the connection area 730 is cone shaped protrusion then the bearing surface is a cone shaped recess 791 such that at least parts of the protrusion fit into the recess. If in the other case the connection area 730 is a cone shaped recess (e.g. on in the first connection element 732) then the bearing surface 791 is a cone shaped protrusion such that at least parts of this protrusion fit into the recess. This is schematically shown in FIG. 9c. In FIGS. 9a, 9b and 9c the same elements as shown in FIG. 7 and in FIG. 8 are designated by the same reference numerals.

In general, the reflective optical element as shown in the embodiments of FIGS. 7 to 9 are at least partly fixed to the bearing element 790 by an adhesive bond and/or by a metallic continuity bond and/or by a form fit bond. Here the adhesive bond may also include a wring connection. The at least one fixation surface 731 and the at least one bearing surface 791 are at least partly in direct and/or indirect contact to each other to fix the optical element in the predetermined spatial position with a resultant bearing force which is almost parallel to the gravitational force G of the reflective optical element. The parallelism of the resulting bearing force to the line of force L of the gravitational force is within an accuracy of ±1 mrad (±10$^{-3}$ rad), to prevent or minimize any parasitic forces and moments which act on the reflective optical element.

Further, in accordance with the present disclosure the bearing element 790 includes at least one actuation device 761, 762, 763, as schematically shown in FIG. 7a. The at least one actuation device may actuate the bearing element in at least one degree of freedom and/or may deform the bearing element. In FIG. 7a three actuation devices are shown which are constructed e.g. as a bipod structure as it was described in connection with FIG. 4. In this case the bearing element 790 may be actuated in up to six degrees of freedom, and so also the reflective optical element is positioned in space in up to six degrees of freedom.

Figure 10A:
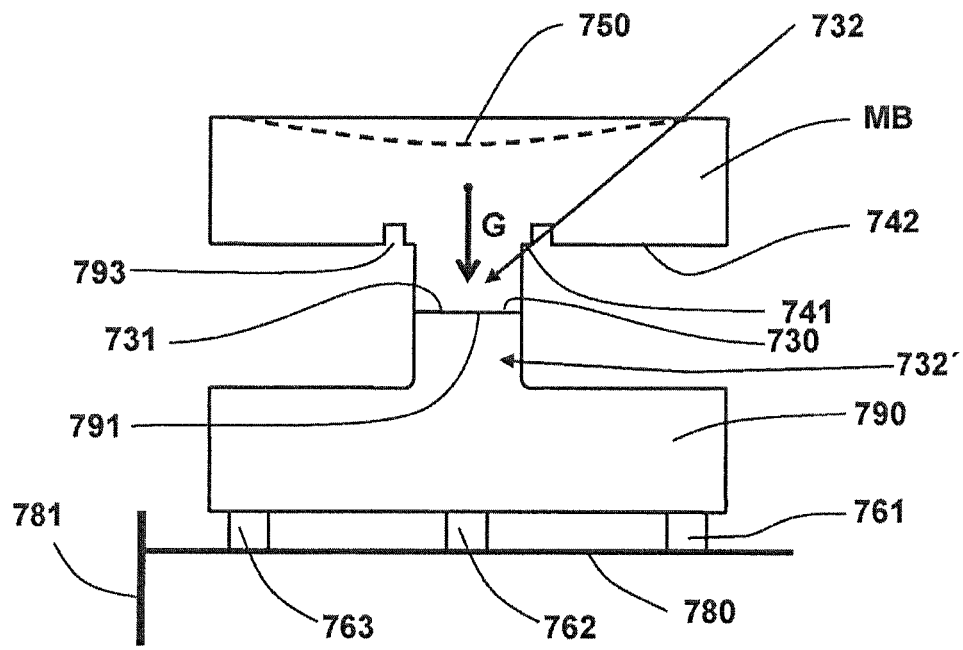
FIGS. 10a to 10c schematically show various embodiments of the connection area of the reflective optical element and the bearing surface, which are connected with various connection elements in accordance to the present disclosure.

In the embodiments of the reflective optical element as described in connection with FIGS. 7 to 9, the single connection area 730 is formed on a first connection element 732. This first connection element 732 is integrally formed onto the mirror body MB as a protruding element such as a pillar or stand. Alternative or in addition, the bearing element 790 may include a protruding element forming a second connection element 732' on which the bearing surface 791 is arranged. Such an embodiment is shown in FIG. 10a in which the same elements as in FIG. 7 to FIG. 9 are designated with the same reference numerals. Both protruding first and second elements 732, 732' are integrally formed onto the optical element and the bearing element 790 to form respective monolithic elements.

Figure 10B:
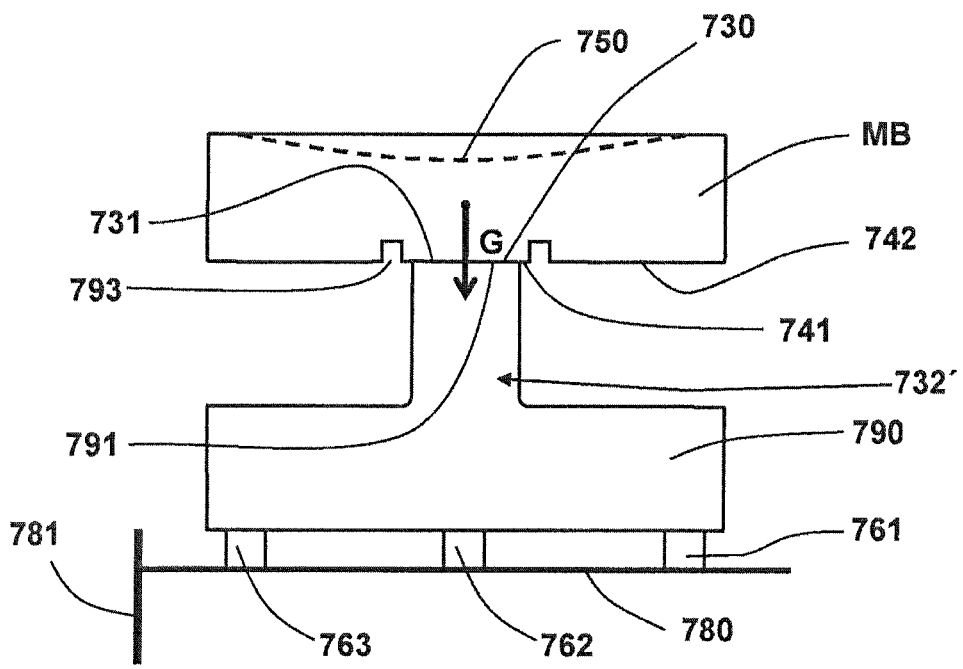

In a further embodiment, as schematically shown in FIG. 10b, the connection area 730 is not an area which is protruded out of the body MB. The connection area is formed in the same plane as the second non-reflective surface, or it is even formed in a recess of the body MB of the reflective optical element. This has the advantage that the reflective optical element can be formed with less material due to the missing protrusion for the connection element 732 which is more cost effective. Further, the protrusion 732' may be formed on the bearing element 790 which can be made of a cheaper material.

Figure 10C:
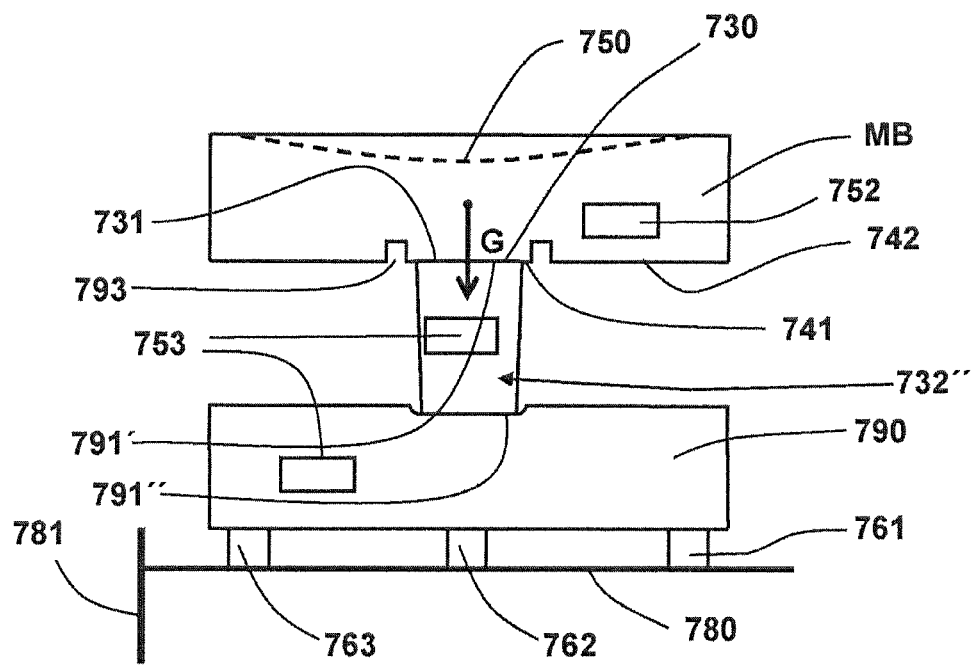

As an alternative, even the bearing element 790 may have no integrally formed protrusion. In this case a separate element 732" with the form of a pillar or stud is arranged at the bearing element 790 and at the reflective optical element on the connection area 730. Such an embodiment is schematically shown in FIG. 10c. The separate element 732" is e.g. connected by a wring connection and/or the glue bonds 791" to the bearing element 790. In addition, the adhesive bond with a glue may be replaced or supplemented by other adhesive bonds such as solder connections or welding connections. Similarly, the separate element 932" is connected to the reflective optical element at the connection area 730 on the fixation surface 731 by the connection 791'. As a connection 791', any connection as described with the present disclosure may be used. Further, as shown in FIG. 10c, the separate element 732" may be inserted into a recess which is formed into the bearing element 790. Similar the reflective optical element may include a recess which includes the connection area and into which the separate element 732" is inserted. In addition, the separate element 732" not necessarily is a prismatic body. With the cross-section, the length, the material of the separate element 732" and the respective connections to the bearing element 790 and to the reflective optical element, the lowest eigenfrequency for the system consisting of reflective optical element, separate element 732", bearing element 790 and any glue or adhesive connection can be adjusted.

In a further embodiment of the present disclosure the body MB and/or the first connection element 732 include a second reflective surface 752 and/or a grating. In addition or alternatively, the bearing element 790 and/or the second connection element 732' and/or the separate element 732" includes a third reflecting surface 753 and/or a grating. In FIG. 10c such additional second and third reflective surfaces or gratings are schematically shown. Such reflective surfaces 752, 753 or gratings may be used in connection with a sensor system or a measuring system which determines the spatial position of the respective element with the additional reflective surface 752, 753 or grating.

In a further embodiment of the present disclosure the reflective optical element is thermally shielded by a thermal shield 760, as schematically shown in FIG. 7a. Preferably the thermal shield 760 is arranged between the second non-reflective surface 742 of the reflective optical element and the bearing element 790. The thermal shield 760 is preferably arranged in the space between the reflective optical element and the bearing element 790, the space is formed by the first, second or separate connection element 732, 732', 732". Preferably, the material of the connection element 732, 732', 732" is such that the thermal conduction by the connection element is negligible. So the connection element itself forms a thermal shield, also due to its comparatively small cross-section. Further, the thermal shield 760 also protects the reflective optical element from any thermal influence generated by any actuators 761, 762, 763, which may be arranged in the support structures.

Figure 11:
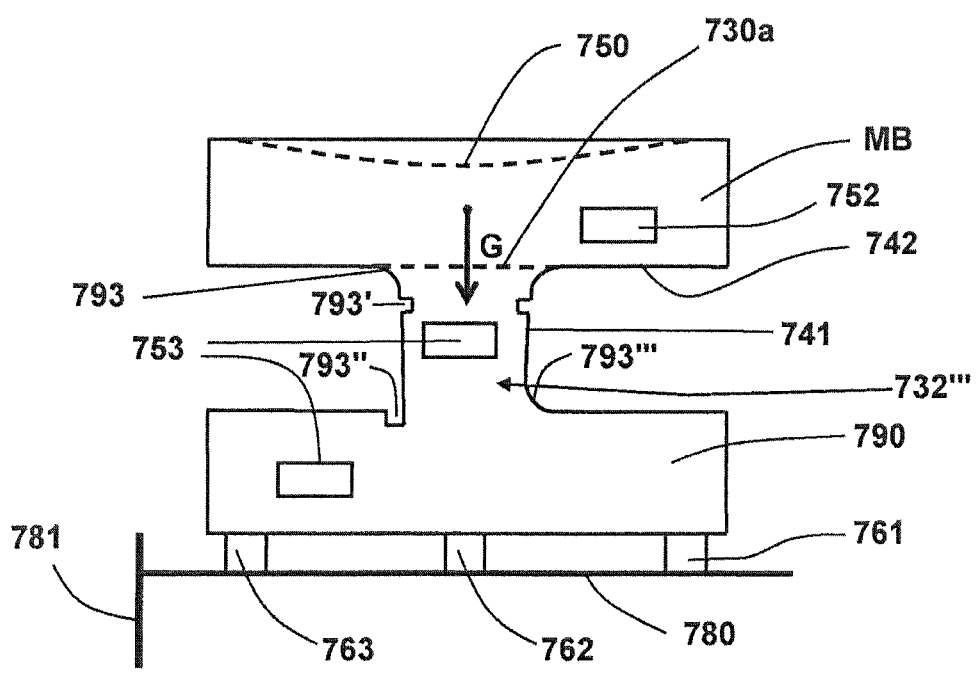
FIG. 11 schematically shows an embodiment of the present disclosure in which the mirror body and the bearing element is formed from one piece. Various examples of stress relief features are shown which can be used in combination or as alternatives.

In a further alternative embodiment of the disclosure, as it is schematically shown in FIG. 11, and in which the same elements as in the previous FIGS. 7 to 10 are designated with the same reference numerals, the reflective optical element includes a body MB with a first reflective surface 750 of a high precision geometrical form for reflecting light in a wavelength range less than 50 nm in an EUV-lithographic projection exposure system. Further, the body MB includes a first and a second non-reflecting surface 741 and 742. However, the first non-reflective surface 741 in this embodiment is mainly formed by the surface of a single connection element 732''', which is integrally formed onto the body MB (and being part of the body MB), forming a protruding element, and which connects a bearing element 790 to the body MB. In addition, the second non-reflecting surface 742 is different from the first non-reflective surface 741, and the second non-reflecting surface 742 at least partly surrounds the single connection element 732''' that mainly forms the first non-reflective surface 741, as mentioned. The body MB further includes at least one stress relief feature 793. In general, the stress relief feature 793 is formed into the body, or it is formed onto the body, as described in connection with the previous embodiments of the present disclosure. In FIG. 11 the stress relief feature 793 is a curved surface that is formed onto the single connection element 732'''. In addition, the stress relief feature 793 at least partly separates the first non-reflective surface 741 from the second non-reflecting surface 742. Preferably, the body MB with the connection element 732''' and the bearing element 790 is made from one monolithic piece as it can be seen from FIG. 11. In FIG. 11, the gravitational force G of a part of the mirror body MB is shown. The part of the mirror body in this example is defined as a body that limits the volume of the optical element such that this volume has no protruding elements. Such the part of the mirror body is limited by a border area 730*a* onto which the single connection element 732''' is formed. Further, the connection element 732''' may include an additional stress relief feature, such as a recess 793' that is formed into its surface, which forms the first non-reflective surface. Further, the bearing element 790 may also include stress relief features 793". 793", such as recesses or curved surfaces as shown in FIG. 11. The protruding single connection element 732" is of such a shape that in the working or operation position of the reflective optical element the line of force of the gravitational force G of the mentioned part of the mirror body crosses the border area 730*a*. Preferably, this line of force crosses the border area 730*a* under 90°. Further, it is preferred that the single connection element 732''' is arranged symmetrically relative to the mentioned line of force.

What is claimed is:

1. An optical element, comprising:
    a body, comprising:
        a first reflective surface configured to reflect EUV light in a wavelength range less than 50 nm;
        a first non-reflective surface;
        a single connection area, the single connection area being on the first non-reflective surface, the single connection area having a fixation surface configured to fix the body to a bearing surface of a bearing element;
        a second non-reflective surface, the second non-reflective surface being different from the single connection area, and the second non-reflective surface at least partially surrounding the single connection area; and
        a stress relief feature at least partially separating the first non-reflective surface from the second non-reflective surface.

2. The optical element according to claim 1, wherein the stress relief feature includes a recess or a curved surface.

3. The optical element according to claim 1, wherein the single connection area is on a side of the body about opposite the first reflective surface.

4. The optical element according to claim 1, wherein the second non-reflective surface completely surrounds the single connection area.

5. The optical element according to claim 1, wherein the stress relief feature separates the single connection area from the second non-reflective surface.

6. The optical element according to claim 1, further comprising the bearing element, wherein the body is fixed to the bearing element, and a line of force of gravitational force of the optical element, which is effective on the centre center of gravity of the optical element, intersects the single connection area.

7. The optical element according to claim 6, wherein the single connection area is a planar area, and the planar area is arranged perpendicular to the line of force.

8. The optical element according to claim 6, wherein the single connection area is symmetrically arranged relative to the line of force.

9. The optical element according to claim 6, wherein the body is rigidly fixed to the bearing element.

10. The optical element according to claim 9, wherein the body is fixed to the bearing element by at least one bond selected from the group consisting of an adhesive bond, a metallic continuity bond and a form fit bond.

11. The optical element according to claim 6, wherein the fixation surface and the bearing surface at least partly contact each other to fix the optical element with a resultant bearing force which generates no moments with respect to the centre center of gravity of the optical element.

12. The optical element according to claim 1, further comprising the bearing element, wherein the bearing element comprises an actuation device configured to actuate the bearing element in at least one degree of freedom and/or to deform the bearing element.

13. The optical element according to claim 1, comprising a connection element including the connection area, wherein the connection element is an integral element of the body.

14. The optical element according to claim 1, further comprising the bearing element, wherein the bearing element comprises a connection element, and the bearing surface is on the connection element.

15. The optical element according to claim 14, wherein the bearing element comprises a reflective surface and/or a reflective grating.

16. The optical element according to claim 1, further comprising the bearing element, wherein the body and the bearing element are a monolithic element.

17. The optical element according to claim 1, wherein the first reflective surface includes an area which is curved along at least one direction.

18. The optical element according to claim 1, wherein the body comprises a second reflective surface and/or a reflective grating.

19. A system, comprising:
an optical element according to claim 1,
wherein the system is an EUV-lithographic projection exposure system.

20. An objective, comprising:
an optical element according to claim 1,
wherein the objective is an EUV-lithographic projection objective.

21. The optical element according to claim 1, wherein the first and second non-reflective surface extend in the same plane.

22. The optical element according to claim 1, wherein the stress relief extends from the first non-reflective surface toward the first reflective surface.

23. The optical element according to claim 1, wherein the second non-reflective surface surrounds the first non-reflective surface.

24. The optical element according to claim 1, wherein the stress relief is between the first and second non-reflective surfaces.

25. The optical element according to claim 24, wherein the stress relief extends in a direction perpendicular to the first and second non-reflective surfaces.

26. The optical element according to claim 24, wherein the stress relief extends from the first non-reflective surface toward the first reflective surface.

27. The optical element according to claim 1, wherein the EUV light has a wavelength of at least five nanometers.

28. The optical element according to claim 1, wherein the EUV light has a wavelength of from five nanometers to 15 nanometers.

29. An optical element, comprising:
a body, comprising:
a reflective surface configured to reflect EUV light in a wavelength range less than 50 nm;
a non-reflective surface;
a single connection area, the single connection area being on the non-reflective surface, the single connection area having a fixation surface configured to fix the body to a bearing surface of a bearing element; and
a stress relief feature at least partially separating the reflective surface from the non-reflective surface.

30. The optical element according to claim 29, wherein the EUV light has a wavelength of at least five nanometers.

31. The optical element according to claim 29, wherein the EUV light has a wavelength of from five nanometers to 15 nanometers.

32. An optical element, comprising:
a bearing element; and
a body, comprising:
a reflective surface configured to reflect EUV light in a wavelength range less than 50 nm;
a single connection element defining a first non-reflective surface, the single connection element connecting the body and the bearing element;
a second non-reflective surface different from the first non-reflective surface, the second non-reflective surface at least partially surrounding the single connection element; and
a stress relief feature at least partially separating the reflective surface from the non-reflective surface.

33. The reflective optical element according to claim 32, wherein the body and the bearing element are a monolithic element.

34. The optical element according to claim 32, wherein the EUV light has a wavelength of at least five nanometers.

35. The optical element according to claim 32, wherein the EUV light has a wavelength of from five nanometers to 15 nanometers.

* * * * *